(12) United States Patent
Sharette et al.

(10) Patent No.: US 9,530,716 B2
(45) Date of Patent: Dec. 27, 2016

(54) APPARATUS, SYSTEM, AND METHOD FOR TRANSFERRING HEAT FROM MEMORY COMPONENTS

(75) Inventors: David Sharette, Sandy, UT (US); Kris Nosack, Orem, UT (US)

(73) Assignee: SanDisk Technologies Inc., Plano, TX (US)

(*) Notice: Subject to any disclaimer, the term of this patent is extended or adjusted under 35 U.S.C. 154(b) by 1106 days.

(21) Appl. No.: 13/452,767

(22) Filed: Apr. 20, 2012

(65) Prior Publication Data

US 2013/0279232 A1  Oct. 24, 2013

(51) Int. Cl.
*H01L 23/36* (2006.01)
*H01L 23/373* (2006.01)
*H01L 23/427* (2006.01)
*G11C 7/04* (2006.01)

(52) U.S. Cl.
CPC ............ *H01L 23/373* (2013.01); *H01L 23/36* (2013.01); *H01L 23/427* (2013.01); *G11C 7/04* (2013.01); *H01L 2224/16225* (2013.01); *H01L 2224/73253* (2013.01)

(58) Field of Classification Search
CPC .. H01L 23/36; H01L 23/40; H01L 2023/1037; H01L 2023/4043; H01L 2023/405; H01L 2023/4056; H01L 2023/4068
See application file for complete search history.

(56) References Cited

U.S. PATENT DOCUMENTS

| | | | |
|---|---|---|---|
| 2004/0173901 A1* | 9/2004 | Mallik et al. | 257/738 |
| 2006/0023439 A1* | 2/2006 | Fraley et al. | 361/780 |
| 2010/0078806 A1* | 4/2010 | Chakrapani et al. | 257/712 |
| 2010/0079966 A1* | 4/2010 | Baek | 361/783 |
| 2010/0321895 A1* | 12/2010 | Hill et al. | H05K 7/20 361/715 |
| 2012/0063231 A1* | 3/2012 | Wood et al. | 365/185.18 |

* cited by examiner

*Primary Examiner* — Hoai V Pham
(74) *Attorney, Agent, or Firm* — Stoel Rives LLP

(57) ABSTRACT

The apparatus to transfer heat from memory components includes a first non-volatile memory component and a second non-volatile memory component. The apparatus includes a heat spreading material in thermal communication with the first non-volatile memory component and the second non-volatile memory component. The heat spreading material is configured to transfer heat from the first non-volatile memory component and the second non-volatile memory component.

26 Claims, 9 Drawing Sheets

APPARATUS, SYSTEM, AND METHOD FOR TRANSFERRING HEAT FROM MEMORY COMPONENTS

TECHNICAL FIELD

This disclosure relates to memory components and more particularly relates to transferring heat from memory components.

BACKGROUND

Electronic components typically generate heat during operation, including electronic computer components. Often, the temperature of an electronic component affects performance and the lifespan of the electronic component. Heat may even destroy some components, such as processors, if some form of cooling is not used.

A typical circuit board may include multiple electronic components, many of which may reach different temperatures during operation. In certain instances, even components of the same type, such as memory components used to store data, operate at varying temperatures. Certain operations performed on components may be temperature sensitive. As a result, applying a common operation to multiple components of varying temperatures may yield varying or unexpected results.

BRIEF SUMMARY

In one embodiment, the apparatus includes a first non-volatile memory component and a second non-volatile memory component. In a further embodiment, the apparatus includes a heat spreading material in thermal communication with the first non-volatile memory component and the second non-volatile memory component. The heat spreading material may be configured to transfer heat from the first non-volatile memory component and the second non-volatile memory component.

In one embodiment, the heat spreading material includes a thermally anisotropic material having higher thermal conductivity within a plane of the heat spreading material than through the plane. In one embodiment, the thermally anisotropic material includes a graphite based material. In one embodiment, the heat spreading material includes a thermally isotrophic material. In a further embodiment, the thermally isotrophic material includes a copper material or an aluminum material.

In one embodiment, the heat spreading material includes an elongate sheet disposed adjacent to the first and second non-volatile memory components. In one embodiment, the heat spreading material includes a heat pipe disposed adjacent to the first and second non-volatile memory components. In certain embodiments, the apparatus further includes a heat sink in thermal communication with the heat spreading material. The heat sink may be configured to dissipate heat from the heat spreading material.

In one embodiment, the heat spreading material is shaped based on a thermal pattern characteristic of one or more of the first non-volatile memory component and the second non-volatile memory component. In some embodiments, the apparatus includes one or more substrates for the first non-volatile memory component and the second non-volatile memory component. The one or more substrates may provide mechanical support and electrical connections for the first and second non-volatile memory components.

In one embodiment, a controller for the first non-volatile memory component and the second non-volatile memory component is configured to execute one or more temperature dependent management functions in parallel on the first non-volatile memory component and the second non-volatile memory component. In one embodiment, the controller is disposed adjacent to the first non-volatile memory component or the second non-volatile memory component such that the controller increases heat in the first non-volatile memory component or the second non-volatile memory component. In a further embodiment, the first and second non-volatile memory components are electrically coupled to one or more memory buses in parallel. In one embodiment, the apparatus includes a coupling mechanism coupling the heat spreading material to the first and second non-volatile memory components.

In one embodiment, a system includes one or more substrates. In one embodiment, the system includes a hardware controller disposed on the one or more substrates. In one embodiment, the system includes a first non-volatile memory component disposed on the one or more substrates and a second non-volatile memory component disposed on the one or more substrates. In one embodiment, the system includes a thermally conductive material in thermal communication with the first non-volatile memory component and the second non-volatile memory component. The thermally conductive material may be configured to decrease heat in at least one of the first non-volatile memory component and the second non-volatile memory component.

In one embodiment, the system includes a host device in communication with the hardware controller over one or more system buses. In one embodiment, the hardware controller is disposed adjacent to one of the first non-volatile memory component and the second non-volatile memory component such that the hardware controller increases heat in the one of the first non-volatile memory component and the second non-volatile memory component. In one embodiment, the first non-volatile memory component and the second non-volatile memory component are disposed on a first side of the one or more substrates.

In a further embodiment, the system includes a third non-volatile memory component disposed on a second side of the one or more substrates and a fourth non-volatile memory component disposed on the second side of one or more substrates. In a further embodiment, the thermally conductive material is in thermal communication with the third non-volatile memory component and the fourth non-volatile memory component. In another embodiment, the apparatus includes a second thermally conductive material in thermal communication with the third non-volatile memory component and the fourth non-volatile memory component.

In one embodiment, a method includes disposing a first non-volatile memory component on one or more substrates. In one embodiment, the method includes disposing the second non-volatile memory component on the one or more substrates. In one embodiment, the method includes placing a heat spreading material in thermal communication with the first non-volatile memory component and the second non-volatile memory component such that the heat spreading material is configured to transfer heat from the first non-volatile memory component and the second non-volatile memory component.

In a further embodiment, the method includes coupling the heat spreading material to the first and second non-volatile memory components. In one embodiment, the method includes executing one or more temperature dependent management functions in parallel on the first non-volatile memory component and the second non-volatile memory component.

Another embodiment of an apparatus is presented. In one embodiment, the apparatus includes one or more substrates. In one embodiment, the apparatus includes a plurality of non-volatile memory chips disposed in an array on the one or more substrates. The one or more substrates may provide mechanical support and electrical connections for the plurality of non-volatile memory components. In one embodiment, the apparatus includes a graphite sheet disposed adjacent to the plurality of non-volatile memory chips. The graphite sheet may include an elongate sheet configured to transfer heat from the plurality of non-volatile memory chips. In one embodiment, the apparatus includes a controller for the first non-volatile memory component and the second non-volatile memory component. The controller may be configured to execute one or more temperature dependent management functions in parallel on the first non-volatile memory component and the second non-volatile memory component.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
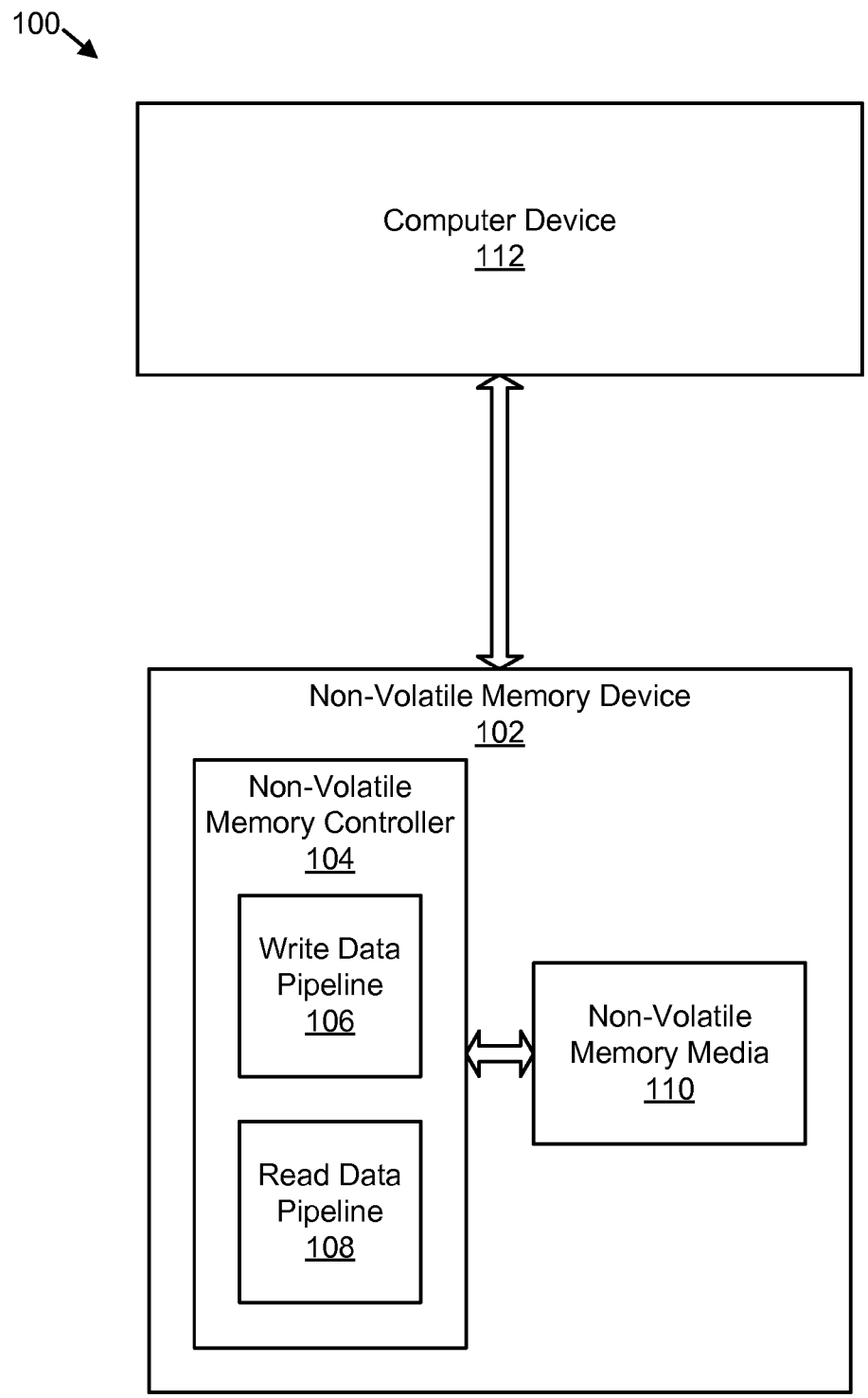
FIG. 1 is a schematic block diagram illustrating one embodiment of a system to transfer heat from memory components.

As will be appreciated by one skilled in the art, aspects of the present invention may be embodied as an apparatus, system, and method.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

Aspects of the present invention are described below with reference to schematic flowchart diagrams and/or schematic block diagrams of methods, apparatuses, systems, and computer program products according to embodiments of the invention. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the schematic flowchart diagrams and/or schematic block diagrams block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer instructions.

Non-Volatile Storage System

FIG. 1 is a schematic block diagram illustrating one embodiment of a system 100 to transfer heat from and/or distribute heat between memory components. The system 100 includes a non-volatile memory device 102, a non-volatile memory controller 104, a write data pipeline 106, a read data pipeline 108, non-volatile memory media 110, and a computer device 112.

The system 100 includes at least one non-volatile memory device 102. In another embodiment, the system 100 includes two or more non-volatile memory devices 102. Each non-volatile memory device 102 may include non-volatile memory media 110. In one embodiment, the non-volatile memory media 110 comprises non-volatile solid-state memory media, such as flash memory, nano random access memory ("nano RAM or NRAM"), magneto-resistive RAM ("MRAM"), dynamic RAM ("DRAM"), phase change RAM ("PRAM"), racetrack memory, memristor memory, nanocrystal wire-based memory, silicon-oxide based sub-10 nanometer process memory, graphene memory, silicon-oxide-nitride-oxide-silicon ("SONOS") memory, resistive random-access memory ("RRAM"), programmable metallization cell ("PMC"), conductive-bridging RAM ("CBRAM"), or the like. In certain embodiments, the non-volatile memory device 102 is a sequential log-based data storage device that stores data in one or more append-only log-based writing structures of the non-volatile memory media 110. The non-volatile memory device 102 is described in more detail with respect to FIGS. 2 and 3.

The non-volatile memory device 102 is in communication with a computer device 112, which may act as a host device for the non-volatile memory device 102. In one embodiment, the non-volatile memory device 102 is internal to the computer device 112 and is connected using a system bus, such as a peripheral component interconnect express ("PCI-e") bus, a Serial Advanced Technology Attachment ("serial ATA") bus, or the like. In another embodiment, the non-volatile memory device 102 is external to the computer device 112 and is connected, a universal serial bus ("USB") connection, an Institute of Electrical and Electronics Engineers ("IEEE") 1394 bus ("FireWire"), or the like. In other embodiments, the non-volatile memory device 102 is connected to the computer device 112 using a peripheral component interconnect ("PCI") express bus using external electrical or optical bus extension or bus networking solution such as Infiniband or PCI Express Advanced Switching ("PCIe-AS"), or the like.

In various embodiments, the non-volatile memory device 102 may be in the form of a dual-inline memory module ("DIMM"), a daughter card, or a micro-module. In another embodiment, the non-volatile memory device 102 is an element within a rack-mounted blade. In another embodiment, the non-volatile memory device 102 is contained within a package that is integrated directly onto a higher level assembly (e.g. mother board, lap top, graphics processor). In another embodiment, individual components comprising the non-volatile memory device 102 are integrated directly onto a higher level assembly without intermediate packaging.

The non-volatile memory device 102 includes one or more non-volatile memory controllers 104. A non-volatile memory controller 104 may include a write data pipeline 106 and a read data pipeline 108. Each non-volatile memory controller 104 is in communication with and manages non-volatile memory media 110. The non-volatile memory controller 104, the write data pipeline 106, the read data pipeline 108, and the non-volatile memory media 110 are described in more detail below with respect to FIGS. 2 and 3.

The system 100 includes one or more computer devices 112 connected to the non-volatile memory device 102. A computer device 112 may be a host device, a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a computer device 112 may be a client and the non-volatile memory device 102 operates autonomously to service data requests sent from the computer device 112. In this embodiment, the computer device 112 and non-volatile memory device 102 may be connected using a computer network, system bus, or other communication means suitable for connection between a computer device 112 and an autonomous non-volatile memory device 102.

In one embodiment, the system 100 includes one or more clients connected to one or more computer devices 112 through one or more computer networks. A client may be a host device, a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The computer network may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The computer network may also include a network from the IEEE 802 family of network technologies, such Ethernet, token ring, WiFi, WiMax, and the like.

The computer network may include servers, switches, routers, cabling, radios, and other equipment used to facilitate networking computer devices 112 and clients. In one embodiment, the system 100 includes multiple computer devices 112 that communicate as peers over a computer network. In another embodiment, the system 100 includes multiple non-volatile memory devices 102 that communicate as peers over a computer network. One of skill in the art, in light of this disclosure, will recognize other computer networks comprising one or more computer networks and related equipment with single or redundant connection between one or more clients or other computer devices 112 with one or more non-volatile memory devices 102. In one embodiment, the system 100 includes two or more non-volatile memory devices 102 connected through a computer network to a client without a computer device 112.

Non-Volatile Memory Device

Figure 2:
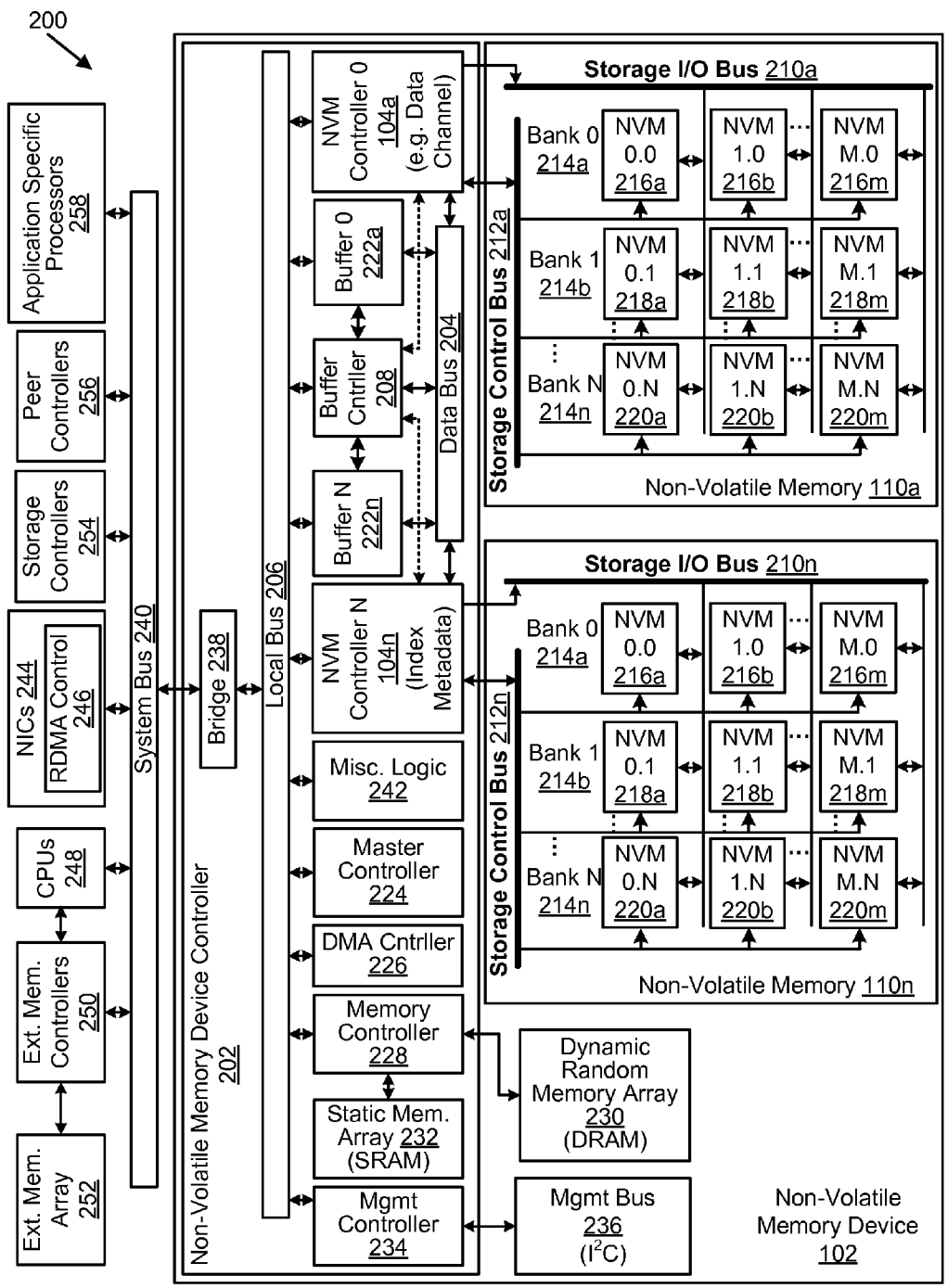
FIG. 2 is a schematic block diagram illustrating one embodiment of a non-volatile memory controller.

FIG. 2 is a schematic block diagram illustrating one embodiment 200 of a non-volatile memory device controller 202 that includes a write data pipeline 106 and a read data pipeline 108 in a non-volatile memory device 102. The non-volatile memory device controller 202 may include a number of non-volatile memory controllers 0-N 104a-n, each controlling non-volatile memory media 110. In the depicted embodiment, two non-volatile memory controllers are shown: non-volatile memory controller 0 104a and non-volatile memory controller N 104n, and each controls non-volatile memory media 110a-n. In the depicted embodiment, non-volatile memory controller 0 104a controls a data channel so that the attached non-volatile memory media 110a stores data. Non-volatile memory controller N 104n controls an index metadata channel associated with the stored data and the associated non-volatile memory media 110n stores index metadata. In an alternate embodiment, the non-volatile memory device controller 202 includes a single non-volatile memory controller 104a with a single non-volatile memory media 110a. In another embodiment, there are a plurality of non-volatile memory controllers 104a-n and associated non-volatile memory media 110a-n. In one embodiment, one or more non-volatile controllers 104a-104n-1, coupled to their associated non-volatile memory media 110a-110n-1, control data while at least one non-volatile memory controller 104n, coupled to its associated non-volatile memory media 110n, controls index metadata.

In one embodiment, at least one non-volatile memory controller 104 is field-programmable gate array ("FPGA") and controller functions are programmed into the FPGA. In a particular embodiment, the FPGA is a Xilinx® FPGA. In another embodiment, the non-volatile memory controller 104 comprises components specifically designed as a non-volatile memory controller 104, such as an application-specific integrated circuit ("ASIC") or custom logic solution. Each non-volatile memory controller 104 typically includes a write data pipeline 106 and a read data pipeline 108, which are describe further in relation to FIG. 3. In another embodiment, at least one non-volatile memory controller 104 is made up of a combination FPGA, ASIC, and custom logic components.

Non-Volatile Memory

The non-volatile memory media 110 is an array of non-volatile memory elements 216, 218, 220, arranged in banks 214, and accessed in parallel through a bi-directional storage input/output ("I/O") bus 210. The storage I/O bus 210, in one embodiment, is capable of unidirectional communication at any one time. For example, when data is being written to the non-volatile memory media 110, data cannot be read from the non-volatile memory media 110. In another embodiment, data can flow both directions simultaneously. However bi-directional, as used herein with respect to a data bus, refers to a data pathway that can have data flowing in only one direction at a time, but when data flowing one direction on the bi-directional data bus is stopped, data can flow in the opposite direction on the bi-directional data bus.

A non-volatile memory element (e.g. NVM 0.0 216a) is typically configured as a chip (a package of one or more dies) or a die on a circuit board. As depicted, a non-volatile memory element (e.g. 216a) operates independently or semi-independently of other non-volatile memory elements (e.g. 218a) even if these several elements are packaged together in a chip package, a stack of chip packages, or some other package element. As depicted, a row of non-volatile memory elements 216a, 216b, 216m is designated as a bank 214. As depicted, there may be "n" banks 214a-n and "m" non-volatile memory elements 216a-m, 218a-m, 220a-m per bank in an array of n×m non-volatile memory elements 216, 218, 220 in a non-volatile memory media 110. Of course different embodiments may include different values for n and m. In one embodiment, a non-volatile memory media 110a includes twenty non-volatile memory elements 216, 218, 220 per bank 214 with eight banks 214. In one embodiment, the non-volatile memory media 110a includes twenty four non-volatile memory elements 216, 218, 220 per bank 214 with eight banks 214. In addition to the n×m non-volatile memory elements 216, 218, 220, one or more additional columns (P) may also be addressed and operated in parallel with other non-volatile memory elements 216a, 216b, 216m for one or more rows. The added P columns in one embodiment, store parity data for the portions of an ECC chunk (i.e. an ECC codeword) that span m storage elements for a particular bank. In one embodiment, each non-volatile memory element 216, 218, 220 is comprised of single-level cell ("SLC") devices. In another embodiment, each non-volatile memory element 216, 218, 220 is comprised of multi-level cell ("MLC") devices.

In one embodiment, non-volatile memory elements that share a common storage I/O bus 210a (e.g. 216b, 218b, 220b) are packaged together. In one embodiment, a non-volatile memory element 216, 218, 220 may have one or more dies per chip with one or more chips stacked vertically and each die may be accessed independently. In another embodiment, a non-volatile memory element (e.g. NVM 0.0

216a) may have one or more virtual dies per die and one or more dies per chip and one or more chips stacked vertically and each virtual die may be accessed independently. In another embodiment, a non-volatile memory element NVM 0.0 216a may have one or more virtual dies per die and one or more dies per chip with some or all of the one or more dies stacked vertically and each virtual die may be accessed independently.

In one embodiment, two dies are stacked vertically with four stacks per group to form eight storage elements (e.g. NVM 0.0-NVM 8.0) 216a-220a, each in a separate bank 214a-n. In another embodiment, 24 storage elements (e.g. NVM 0.0-NVM 0.24) 216 form a logical bank 214a so that each of the eight logical banks has 24 non-volatile memory elements (e.g. NVM0.0-NVM 8.24) 216, 218, 220. Data is sent to the non-volatile memory media 110 over the storage I/O bus 210 to all non-volatile memory elements of a particular group of non-volatile memory elements (NVM 0.0-NVM 8.0) 216a, 218a, 220a. The storage control bus 212a is used to select a particular bank (e.g. Bank 0 214a) so that the data received over the storage I/O bus 210 connected to all banks 214 is written just to the selected bank 214a.

In a one embodiment, the storage I/O bus 210 is comprised of one or more independent I/O buses ("IIOBa-m" comprising 210a.a-m, 210n.a-m) wherein the non-volatile memory elements within each column share one of the independent I/O buses that accesses each non-volatile memory element 216, 218, 220 in parallel so that all banks 214 are accessed simultaneously. For example, one channel of the storage I/O bus 210 may access a first non-volatile memory element 216a, 218a, 220a of each bank 214a-n simultaneously. A second channel of the storage I/O bus 210 may access a second non-volatile memory element 216b, 218b, 220b of each bank 214a-n simultaneously. Each row of non-volatile memory element 216a, 216b, 216m is accessed simultaneously. In one embodiment, where non-volatile memory elements 216, 218, 220 are multi-level (physically stacked), all physical levels of the non-volatile memory elements 216, 218, 220 are accessed simultaneously. As used herein, "simultaneously" also includes near simultaneous access where devices are accessed at slightly different intervals to avoid switching noise. Simultaneously is used in this context to be distinguished from a sequential or serial access wherein commands and/or data are sent individually one after the other.

Typically, banks 214a-n are independently selected using the storage control bus 212. In one embodiment, a bank 214 is selected using a chip enable or chip select. Where both chip select and chip enable are available, the storage control bus 212 may select one level of a multi-level non-volatile memory element 216, 218, 220. In other embodiments, other commands are used by the storage control bus 212 to individually select one level of a multi-level non-volatile memory element 216, 218, 220. Non-volatile memory elements 216, 218, 220 may also be selected through a combination of control and of address information transmitted on storage I/O bus 210 and the storage control bus 212.

In one embodiment, each non-volatile memory element 216, 218, 220 is partitioned into erase blocks and each erase block is partitioned into pages. An erase block on a non-volatile memory element 216, 218 220 may be called a physical erase block or "PEB." A typical page is 2000 bytes ("2 kB"). In one example, a non-volatile memory element (e.g. NVM 0.0) includes two registers and can program two pages so that a two-register non-volatile memory element 216, 218, 220 has a capacity of 4 kB. A bank 214 of 20 non-volatile memory elements 216a, 216b, 216m would then have an 80 kB capacity of pages accessed with the same address going out the channels of the storage I/O bus 210.

This group of pages in a bank 214 of non-volatile memory elements 216a, 216b, 216m of 80 kB may be called a logical page or virtual page. Similarly, an erase block of each non-volatile memory element 216a-m of a bank 214a may be grouped to form a logical erase block or a virtual erase block. In one embodiment, an erase block of pages within a non-volatile memory element 216, 218, 220 is erased when an erase command is received within a non-volatile memory element 216, 218, 220. Whereas the size and number of erase blocks, pages, planes, or other logical and physical divisions within a non-volatile memory element 216, 218, 220 are expected to change over time with advancements in technology, it is to be expected that many embodiments consistent with new configurations are possible and are consistent with the general description herein.

Typically, when a packet is written to a particular location within a non-volatile memory element 216, 218, 220, wherein the packet is intended to be written to a location within a particular page which is specific to a particular physical erase block of a particular non-volatile memory element of a particular bank, a physical address is sent on the storage I/O bus 210 and followed by the packet. The physical address contains enough information for the non-volatile memory element 216, 218, 220 to direct the packet to the designated location within the page. Since all non-volatile memory elements in a column of storage elements (e.g. NVM 0.0-NVM N.0 216a, 218a, 220a) are accessed simultaneously by the appropriate bus within the storage I/O bus 210a.a, to reach the proper page and to avoid writing the data packet to similarly addressed pages in the column of non-volatile memory elements (NVM 0.0-NVM N.0 216a, 218a, 220a), the bank 214a that includes the non-volatile memory element NVM 0.0 216a with the correct page where the data packet is to be written is simultaneously selected by the storage control bus 212.

Similarly, satisfying a read command on the storage I/O bus 210 requires a simultaneous signal on the storage control bus 212 to select a single bank 214a and the appropriate page within that bank 214a. In one embodiment, a read command reads an entire page, and because there are multiple non-volatile memory elements 216a, 216b, 216m in parallel in a bank 214, an entire logical page is read with a read command. However, the read command may be broken into subcommands, as will be explained below with respect to bank interleave. A logical page may also be accessed in a write operation.

An erase block erase command may be sent out to erase an erase block over the storage I/O bus 210 with a particular erase block address to erase a particular erase block. Typically, an erase block erase command may be sent over the parallel paths of the storage I/O bus 210 to erase a logical erase block, each with a particular erase block address to erase a particular erase block. Simultaneously a particular bank (e.g. Bank 0 214a) is selected over the storage control bus 212 to prevent erasure of similarly addressed erase blocks in all of the banks (Banks 1-N 214b-n). Alternatively, no particular bank (e.g. Bank 0 214a) is selected over the storage control bus 212 to enable erasure of similarly addressed erase blocks in all of the banks (Banks 1-N 214b-n) simultaneously. Other commands may also be sent to a particular location using a combination of the storage I/O bus 210 and the storage control bus 212. One of skill in the art will recognize other ways to select a particular storage location using the bi-directional storage I/O bus 210 and the storage control bus 212.

In one embodiment, packets are written sequentially to the non-volatile memory media 110. For example, packets are streamed to the storage write buffers of a bank 214a of non-volatile memory elements 216 and when the buffers are full, the packets are programmed to a designated logical page. Packets then refill the storage write buffers and, when full, the packets are written to the next logical page. The next logical page may be in the same bank 214a or another bank (e.g. 214b). This process continues, logical page after logical page, typically until a logical erase block is filled. In another embodiment, the streaming may continue across logical erase block boundaries with the process continuing, logical erase block after logical erase block.

In a read, modify, write operation, data packets associated with requested data are located and read in a read operation. Data segments of the modified requested data that have been modified are not written to the location from which they are read. Instead, the modified data segments are again converted to data packets and then written sequentially to the next available location in the logical page currently being written. The index entries for the respective data packets are modified to point to the packets that contain the modified data segments. The entry or entries in the index for data packets associated with the same requested data that have not been modified will include pointers to original location of the unmodified data packets. Thus, if the original requested data is maintained, for example to maintain a previous version of the requested data, the original requested data will have pointers in the index to all data packets as originally written. The new requested data will have pointers in the index to some of the original data packets and pointers to the modified data packets in the logical page that is currently being written.

In a copy operation, the index includes an entry for the original requested data mapped to a number of packets stored in the non-volatile memory media 110. When a copy is made, a new copy of the requested data is created and a new entry is created in the index mapping the new copy of the requested data to the original packets. The new copy of the requested data is also written to the non-volatile memory media 110 with its location mapped to the new entry in the index. The new copy of the requested data packets may be used to identify the packets within the original requested data that are referenced in case changes have been made in the original requested data that have not been propagated to the copy of the requested data and the index is lost or corrupted.

Beneficially, sequentially writing packets facilitates a more even use of the non-volatile memory media 110 and allows the non-volatile memory device controller 202 to monitor storage hot spots and level usage of the various logical pages in the non-volatile memory media 110. Sequentially writing packets also facilitates a powerful, efficient garbage collection system, which is described in detail below. One of skill in the art, in light of this disclosure, will recognize other benefits of sequential storage of data packets.

Non-Volatile Memory Device Controller

In various embodiments, the non-volatile memory device controller 202 also includes a data bus 204, a local bus 206, a buffer controller 208, buffers 0-N 222a-n, a master controller 224, a direct memory access ("DMA") controller 226, a memory controller 228, a dynamic memory array 230, a static random memory array 232, a management controller 234, a management bus 236, a bridge 238 to a system bus 240, and miscellaneous logic 242, which are described below. In other embodiments, the system bus 240 is coupled to one or more network interface cards ("NICs") 244, some of which may include remote DMA ("RDMA") controllers 246, one or more central processing unit ("CPU") 248, one or more external memory controllers 250 and associated external memory arrays 252, one or more storage controllers 254, peer controllers 256, and application specific processors 258, which are described below. The components 244-258 connected to the system bus 240 may be located in the computer device 112 or may be other devices.

Typically the non-volatile memory controller(s) 104 communicate data to the non-volatile memory media 110 over a storage I/O bus 210. In a typical embodiment where the non-volatile memory is arranged in banks 214 and each bank 214 includes multiple non-volatile memory elements 216a, 216b, 216m accessed in parallel, the storage I/O bus 210 is an array of busses, one for each column of non-volatile memory elements 216, 218, 220 spanning the banks 214. As used herein, the term "storage I/O bus" may refer to one storage I/O bus 210 or an array of data independent busses 204. In one embodiment, each storage I/O bus 210 accessing a column of non-volatile memory elements (e.g. 216a, 218a, 220a) may include a logical-to-physical mapping for storage divisions (e.g. erase blocks) accessed in a column of non-volatile memory elements 216a, 218a, 220a. This mapping (or bad block remapping) allows a logical address mapped to a physical address of a storage division to be remapped to a different storage division if the first storage division fails, partially fails, is inaccessible, or has some other problem.

Data may also be communicated to the non-volatile memory controller(s) 104 from a requesting device, such as a computer device 112, through the system bus 240, bridge 238, local bus 206, buffer(s) 222, and finally over a data bus 204. The data bus 204 typically is connected to one or more buffers 222a-n controlled with a buffer controller 208. The buffer controller 208 typically controls transfer of data from the local bus 206 to the buffers 222 and through the data bus 204 to the pipeline input buffer 306 and output buffer 330. The buffer controller 208 typically controls how data arriving from a requesting device can be temporarily stored in a buffer 222 and then transferred onto a data bus 204, or vice versa, to account for different clock domains, to prevent data collisions, etc. The buffer controller 208 typically works in conjunction with the master controller 224 to coordinate data flow. As data arrives, the data will arrive on the system bus 240, be transferred to the local bus 206 through a bridge 238.

Typically the data is transferred from the local bus 206 to one or more data buffers 222 as directed by the master controller 224 and the buffer controller 208. The data then flows out of the buffer(s) 222 to the data bus 204, through a non-volatile memory controller 104, and on to the non-volatile memory media 110 such as NAND flash or other non-volatile memory media. In one embodiment, data and associated out-of-band metadata ("metadata") arriving with the data is communicated using one or more data channels comprising one or more non-volatile memory controllers 104a-104n-1 and associated non-volatile memory media 110a-110n-1 while at least one channel (non-volatile memory controller 104n, non-volatile memory media 110n) is dedicated to in-band metadata, such as index information and other metadata generated internally to the non-volatile memory device 102.

The local bus 206 is typically a bidirectional bus or set of busses that allows for communication of data and commands between devices internal to the non-volatile memory device controller 202 and between devices internal to the non-volatile memory device 102 and devices 244-258 connected to the system bus 240. The bridge 238 facilitates communication between the local bus 206 and system bus 240. One of skill in the art will recognize other embodiments such as ring structures or switched star configurations and functions of buses 240, 206, 204, 210 and bridges 238.

The system bus 240 is typically a bus of a computer device 112 or other device in which the non-volatile memory device 102 is installed or connected. In one embodiment, the system bus 240 may be a PCI-e bus, a Serial Advanced Technology Attachment ("serial ATA") bus, parallel ATA, or the like. In another embodiment, the system bus 240 is an external bus such as small computer system interface ("SCSI"), FireWire, Fiber Channel, USB, PCIe-AS, or the like. The non-volatile memory device 102 may be packaged to fit internally to a device or as an externally connected device.

The non-volatile memory device controller 202 includes a master controller 224 that controls higher-level functions within the non-volatile memory device 102. The master controller 224, in various embodiments, controls data flow by interpreting object requests and other requests, directs creation of indexes to map object identifiers associated with data to physical locations of associated data, coordinating DMA requests, etc. Many of the functions described herein are controlled wholly or in part by the master controller 224.

In one embodiment, the master controller 224 uses embedded controller(s). In another embodiment, the master controller 224 uses local memory such as a dynamic memory array 230 (dynamic random access memory "DRAM"), a static memory array 232 (static random access memory "SRAM"), etc. In one embodiment, the local memory is controlled using the master controller 224. In another embodiment, the master controller 224 accesses the local memory via a memory controller 228. In another embodiment, the master controller 224 runs a Linux server and may support various common server interfaces, such as the World Wide Web, hyper-text markup language ("HTML"), etc. In another embodiment, the master controller 224 uses a nano-processor. The master controller 224 may be constructed using programmable or standard logic, or any combination of controller types listed above. One skilled in the art will recognize many embodiments for the master controller 224.

In one embodiment, where the storage device/non-volatile memory device controller 202 manages multiple data storage devices/non-volatile memory media 110a-n, the master controller 224 divides the work load among internal controllers, such as the non-volatile memory controllers 104a-n. For example, the master controller 224 may divide an object to be written to the data storage devices (e.g. non-volatile memory media 110a-n) so that a portion of the object is stored on each of the attached data storage devices. This feature is a performance enhancement allowing quicker storage and access to an object. In one embodiment, the master controller 224 is implemented using an FPGA. In another embodiment, the firmware within the master controller 224 may be updated through the management bus 236, the system bus 240 over a network connected to a NIC 244 or other device connected to the system bus 240.

In one embodiment, the master controller 224, which manages objects, emulates block storage such that a computer device 112 or other device connected to the storage device/non-volatile memory device 102 views the storage device/non-volatile memory device 102 as a block storage device and sends data to specific physical addresses in the storage device/non-volatile memory device 102. The master controller 224 then divides up the blocks and stores the data blocks as it would objects. The master controller 224 then maps the blocks and physical address sent with the block to the actual locations determined by the master controller 224. The mapping is stored in the object index. Typically, for block emulation, a block device application program interface ("API") is provided in a driver in a computer such as the computer device 112, or other device wishing to use the storage device/non-volatile memory device 102 as a block storage device.

In another embodiment, the master controller 224 coordinates with NIC controllers 244 and embedded RDMA controllers 246 to deliver just-in-time RDMA transfers of data and command sets. NIC controller 244 may be hidden behind a non-transparent port to enable the use of custom drivers. Also, a driver on a computer device 112 may have access to the computer network 116 through an I/O memory driver using a standard stack API and operating in conjunction with NICs 244.

In one embodiment, the master controller 224 is also a redundant array of independent drive ("RAID") controller. Where the data storage device/non-volatile memory device 102 is networked with one or more other data storage devices/non-volatile memory devices 102, the master controller 224 may be a RAID controller for single tier RAID, multi-tier RAID, progressive RAID, etc. The master controller 224 also allows some objects to be stored in a RAID array and other objects to be stored without RAID. In another embodiment, the master controller 224 may be a distributed RAID controller element. In another embodiment, the master controller 224 may comprise many RAID, distributed RAID, and other functions as described elsewhere. In one embodiment, the master controller 224 controls storage of data in a RAID-like structure where parity information is stored in one or more non-volatile memory elements 216, 218, 220 of a logical page where the parity information protects data stored in the other non-volatile memory elements 216, 218, 220 of the same logical page.

In one embodiment, the master controller 224 coordinates with single or redundant network managers (e.g. switches) to establish routing, to balance bandwidth utilization, failover, etc. In another embodiment, the master controller 224 coordinates with integrated application specific logic (via local bus 206) and associated driver software. In another embodiment, the master controller 224 coordinates with attached application specific processors 258 or logic (via the external system bus 240) and associated driver software. In another embodiment, the master controller 224 coordinates with remote application specific logic (via the computer network 116) and associated driver software. In another embodiment, the master controller 224 coordinates with the local bus 206 or external bus attached hard disk drive ("HDD") storage controller.

In one embodiment, the master controller 224 communicates with one or more storage controllers 254 where the storage device/non-volatile memory device 102 may appear as a storage device connected through a SCSI bus, Internet SCSI ("iSCSI"), fiber channel, etc. Meanwhile the storage device/non-volatile memory device 102 may autonomously manage objects and may appear as an object file system or distributed object file system. The master controller 224 may also be accessed by peer controllers 256 and/or application specific processors 258.

In another embodiment, the master controller 224 coordinates with an autonomous integrated management controller to periodically validate FPGA code and/or controller software, validate FPGA code while running (reset) and/or validate controller software during power on (reset), support external reset requests, support reset requests due to watchdog timeouts, and support voltage, current, power, temperature, and other environmental measurements and setting of threshold interrupts. In another embodiment, the master controller 224 manages garbage collection to free erase blocks for reuse. In another embodiment, the master controller 224 manages wear leveling. In another embodiment, the master controller 224 allows the data storage device/non-volatile memory device 102 to be partitioned into multiple logical devices and allows partition-based media encryption. In yet another embodiment, the master controller 224 supports a non-volatile memory controller 104 with advanced, multi-bit ECC correction. One of skill in the art will recognize other features and functions of a master controller 224 in a storage controller 202, or more specifically in a non-volatile memory device 102.

In one embodiment, the non-volatile memory device controller 202 includes a memory controller 228 which controls a dynamic random memory array 230 and/or a static random memory array 232. As stated above, the memory controller 228 may be independent or integrated with the master controller 224. The memory controller 228 typically controls volatile memory of some type, such as DRAM (dynamic random memory array 230) and SRAM (static random memory array 232). In other examples, the memory controller 228 also controls other memory types such as electrically erasable programmable read only memory ("EEPROM"), etc. In other embodiments, the memory controller 228 controls two or more memory types and the memory controller 228 may include more than one controller. Typically, the memory controller 228 controls as much SRAM 232 as is feasible and by DRAM 230 to supplement the SRAM 232.

In one embodiment, the object index is stored in memory 230, 232 and then periodically off-loaded to a channel of the non-volatile memory media 110n or other non-volatile memory. One of skill in the art will recognize other uses and configurations of the memory controller 228, dynamic memory array 230, and static memory array 232.

In one embodiment, the non-volatile memory device controller 202 includes a DMA controller 226 that controls DMA operations between the storage device/non-volatile memory device 102 and one or more external memory controllers 250 and associated external memory arrays 252 and CPUs 248. Note that the external memory controllers 250 and external memory arrays 252 are called external because they are external to the storage device/non-volatile memory device 102. In addition the DMA controller 226 may also control RDMA operations with requesting devices through a NIC 244 and associated RDMA controller 246.

In one embodiment, the non-volatile memory device controller 202 includes a management controller 234 connected to a management bus 236. Typically the management controller 234 manages environmental metrics and status of the storage device/non-volatile memory device 102. The management controller 234 may monitor device temperature, fan speed, power supply settings, etc. over the management bus 236. The management controller 234 may support the reading and programming of erasable programmable read only memory ("EEPROM") for storage of FPGA code and controller software. Typically the management bus 236 is connected to the various components within the storage device/non-volatile memory device 102. The management controller 234 may communicate alerts, interrupts, etc. over the local bus 206 or may include a separate connection to a system bus 240 or other bus. In one embodiment the management bus 236 is an Inter-Integrated Circuit ("I2C") bus. One of skill in the art will recognize other related functions and uses of a management controller 234 connected to components of the storage device/non-volatile memory device 102 by a management bus 236.

In one embodiment, the non-volatile memory device controller 202 includes miscellaneous logic 242 that may be customized for a specific application. Typically where the non-volatile memory device controller 202 or master controller 224 is/are configured using a FPGA or other configurable controller, custom logic may be included based on a particular application, customer requirement, storage requirement, etc.

Data Pipeline

Figure 3:
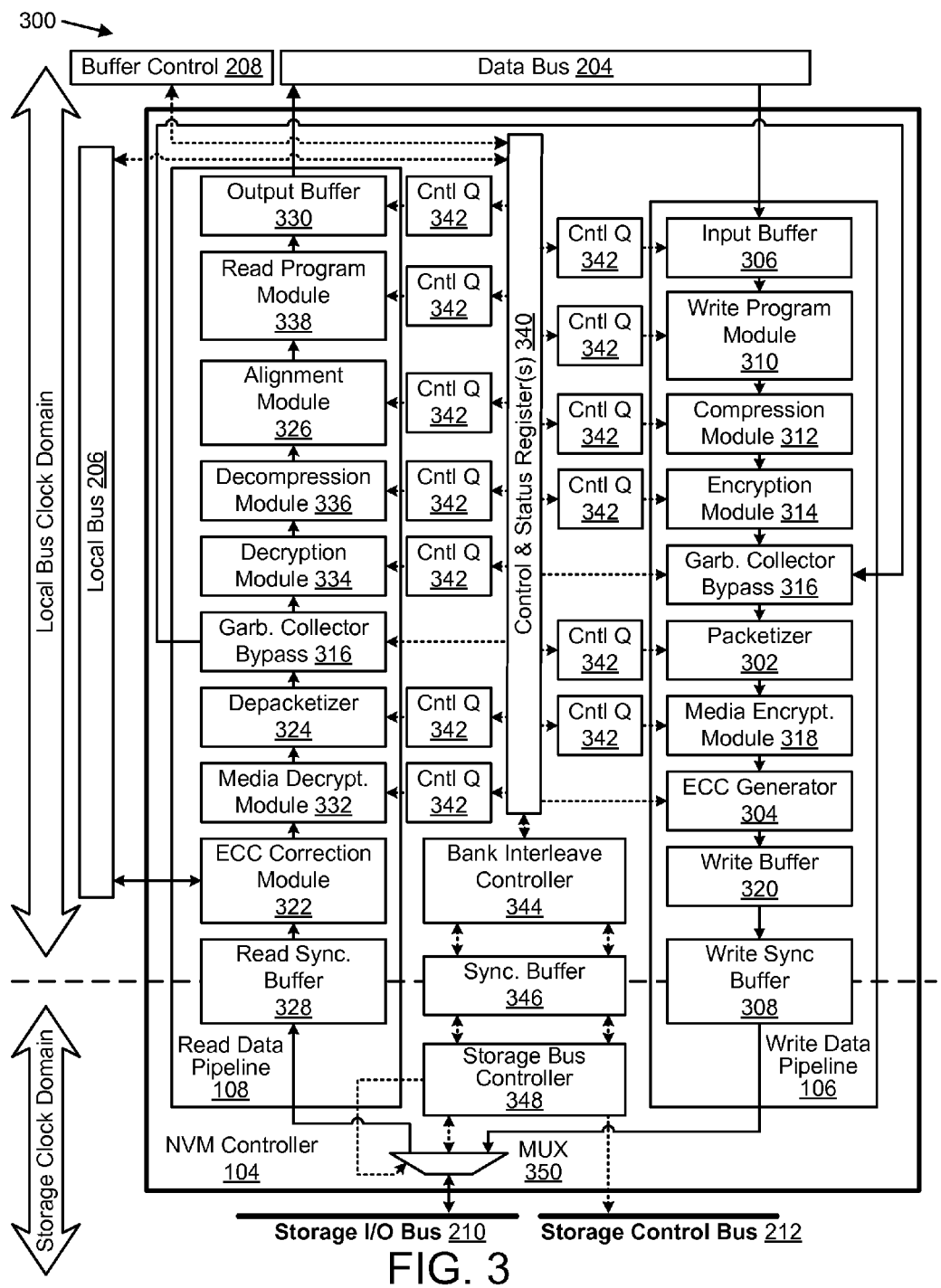
FIG. 3 is a schematic block diagram illustrating one embodiment of a non-volatile memory controller with a write data pipeline and a read data pipeline.

FIG. 3 is a schematic block diagram illustrating one embodiment 300 of a non-volatile memory controller 104 with a write data pipeline 106 and a read data pipeline 108 in a non-volatile memory device 102. The embodiment 300 includes a data bus 204, a local bus 206, and buffer control 208, which are substantially similar to those described in relation to the non-volatile memory device controller 202 of FIG. 2. The write data pipeline 106 includes a packetizer 302 and an error-correcting code ("ECC") generator 304. In other embodiments, the write data pipeline 106 includes an input buffer 306, a write synchronization buffer 308, a write program module 310, a compression module 312, an encryption module 314, a garbage collector bypass 316 (with a portion within the read data pipeline 108), a media encryption module 318, and a write buffer 320. The read data pipeline 108 includes a read synchronization buffer 328, an ECC correction module 322, a depacketizer 324, an alignment module 326, and an output buffer 330. In other embodiments, the read data pipeline 108 may include a media decryption module 332, a portion of the garbage collector bypass 316, a decryption module 334, a decompression module 336, and a read program module 338. The non-volatile memory controller 104 may also include control and status registers 340 and control queues 342, a bank interleave controller 344, a synchronization buffer 346, a storage bus controller 348, and a multiplexer ("MUX") 350. The components of the non-volatile memory controller 104 and associated write data pipeline 106 and read data pipeline 108 are described below. In other embodiments, synchronous non-volatile memory media 110 may be used and synchronization buffers 308 328 may be eliminated.

Write Data Pipeline

The write data pipeline 106 includes a packetizer 302 that receives a data or metadata segment to be written to the non-volatile memory, either directly or indirectly through another write data pipeline 106 stage, and creates one or more packets sized for the non-volatile memory media 110. The data or metadata segment is typically part of a data structure such as an object, but may also include an entire data structure. In another embodiment, the data segment is part of a block of data, but may also include an entire block of data. Typically, a set of data such as a data structure is received from a computer such as the computer device 112, or other computer or device and is transmitted to the non-volatile memory device 102 in data segments streamed to the non-volatile memory device 102. A data segment may also be known by another name, such as data parcel, but as referenced herein includes all or a portion of a data structure or data block.

Each data structure is stored as one or more packets. Each data structure may have one or more container packets. Each packet contains a header. The header may include a header type field. Type fields may include data, attribute, metadata, data segment delimiters (multi-packet), data structures, data linkages, and the like. The header may also include information regarding the size of the packet, such as the number of bytes of data included in the packet. The length of the packet may be established by the packet type. The header may include information that establishes the relationship of the packet to a data structure. An example might be the use of an offset in a data packet header to identify the location of the data segment within the data structure. One of skill in the art will recognize other information that may be included in a header added to data by a packetizer 302 and other information that may be added to a data packet.

Each packet includes a header and possibly data from the data or metadata segment. The header of each packet includes pertinent information to relate the packet to the data structure to which the packet belongs. For example, the header may include an object identifier or other data structure identifier and offset that indicates the data segment, object, data structure or data block from which the data packet was formed. The header may also include a logical address used by the storage bus controller 348 to store the packet. The header may also include information regarding the size of the packet, such as the number of bytes included in the packet. The header may also include a sequence number that identifies where the data segment belongs with respect to other packets within the data structure when reconstructing the data segment or data structure. The header may include a header type field. Type fields may include data, data structure attributes, metadata, data segment delimiters (multi-packet), data structure types, data structure linkages, and the like. One of skill in the art will recognize other information that may be included in a header added to data or metadata by a packetizer 302 and other information that may be added to a packet.

The write data pipeline 106 includes an ECC generator 304 that that generates one or more error-correcting codes ("ECC") for the one or more packets received from the packetizer 302. The ECC generator 304 typically uses an error correcting algorithm to generate ECC check bits which are stored with the one or more data packets. The ECC codes generated by the ECC generator 304 together with the one or more data packets associated with the ECC codes comprise an ECC chunk. The ECC data stored with the one or more data packets is used to detect and to correct errors introduced into the data through transmission and storage. In one embodiment, packets are streamed into the ECC generator 304 as un-encoded blocks of length N. A syndrome of length S is calculated, appended and output as an encoded block of length N+S. The value of N and S are dependent upon the characteristics of the ECC algorithm which is selected to achieve specific performance, efficiency, and robustness metrics. In one embodiment, there is no fixed relationship between the ECC blocks and the packets; the packet may comprise more than one ECC block; the ECC block may comprise more than one packet; and a first packet may end anywhere within the ECC block and a second packet may begin after the end of the first packet within the same ECC block. In one embodiment, ECC algorithms are not dynamically modified. In one embodiment, the ECC data stored with the data packets is robust enough to correct errors in more than two bits.

Beneficially, using a robust ECC algorithm allowing more than single bit correction or even double bit correction allows the life of the non-volatile memory media 110 to be extended. For example, if flash memory is used as the storage medium in the non-volatile memory media 110, the flash memory may be written approximately 100,000 times without error per erase cycle. This usage limit may be extended using a robust ECC algorithm. Having the ECC generator 304 and corresponding ECC correction module 322 onboard the non-volatile memory device 102, the non-volatile memory device 102 can internally correct errors and has a longer useful life than if a less robust ECC algorithm is used, such as single bit correction. However, in other embodiments the ECC generator 304 may use a less robust algorithm and may correct single-bit or double-bit errors. In another embodiment, the non-volatile memory device 110 may comprise less reliable storage such as multi-level cell ("MLC") flash in order to increase capacity, which storage may not be sufficiently reliable without more robust ECC algorithms.

In one embodiment, the write pipeline 106 includes an input buffer 306 that receives a data segment to be written to the non-volatile memory media 110 and stores the incoming data segments until the next stage of the write data pipeline 106, such as the packetizer 302 (or other stage for a more complex write data pipeline 106) is ready to process the next data segment. The input buffer 306 typically allows for discrepancies between the rate data segments are received and processed by the write data pipeline 106 using an appropriately sized data buffer. The input buffer 306 also allows the data bus 204 to transfer data to the write data pipeline 106 at rates greater than can be sustained by the write data pipeline 106 in order to improve efficiency of operation of the data bus 204. Typically when the write data pipeline 106 does not include an input buffer 306, a buffering function is performed elsewhere, such as in the non-volatile memory device 102 but outside the write data pipeline 106, in the computer device 112, such as within a network interface card ("NIC"), or at another device, for example when using remote direct memory access ("RDMA").

In another embodiment, the write data pipeline 106 also includes a write synchronization buffer 308 that buffers packets received from the ECC generator 304 prior to writing the packets to the non-volatile memory media 110. The write synchronization buffer 308 is located at a boundary between a local clock domain and a non-volatile memory clock domain and provides buffering to account for the clock domain differences. In other embodiments, synchronous non-volatile memory media 110 may be used and synchronization buffers 308 328 may be eliminated.

In one embodiment, the write data pipeline 106 also includes a media encryption module 318 that receives the one or more packets from the packetizer 302, either directly or indirectly, and encrypts the one or more packets using an encryption key unique to the non-volatile memory device 102 prior to sending the packets to the ECC generator 304. Typically, the entire packet is encrypted, including the headers. In another embodiment, headers are not encrypted. In this document, encryption key is understood to mean a secret encryption key that is managed externally from a non-volatile memory controller 104.

The media encryption module 318 and corresponding media decryption module 332 provide a level of security for data stored in the non-volatile memory media 110. For example, where data is encrypted with the media encryption module 318, if the non-volatile memory media 110 is connected to a different non-volatile memory controller 104, non-volatile memory device 102, or server, the contents of the non-volatile memory media 110 typically could not be read without use of the same encryption key used during the write of the data to the non-volatile memory media 110 without significant effort.

In a typical embodiment, the non-volatile memory device 102 does not store the encryption key in non-volatile storage and allows no external access to the encryption key. The encryption key is provided to the non-volatile memory controller 104 during initialization. The non-volatile memory device 102 may use and store a non-secret cryptographic nonce that is used in conjunction with an encryption key. A different nonce may be stored with every packet. Data segments may be split between multiple packets with unique nonces for the purpose of improving protection by the encryption algorithm.

The encryption key may be received from a computer device 112, a server, key manager, or other device that manages the encryption key to be used by the non-volatile memory controller 104. In another embodiment, the non-volatile memory media 110 may have two or more partitions and the non-volatile memory controller 104 behaves as though it was two or more non-volatile memory controllers 104, each operating on a single partition within the non-volatile memory media 110. In this embodiment, a unique media encryption key may be used with each partition.

In another embodiment, the write data pipeline 106 also includes an encryption module 314 that encrypts a data or metadata segment received from the input buffer 306, either directly or indirectly, prior sending the data segment to the packetizer 302, the data segment encrypted using an encryption key received in conjunction with the data segment. The encryption keys used by the encryption module 314 to encrypt data may not be common to all data stored within the non-volatile memory device 102 but may vary on an per data structure basis and received in conjunction with receiving data segments as described below. For example, an encryption key for a data segment to be encrypted by the encryption module 314 may be received with the data segment or may be received as part of a command to write a data structure to which the data segment belongs. The non-volatile memory device 102 may use and store a non-secret cryptographic nonce in each data structure packet that is used in conjunction with the encryption key. A different nonce may be stored with every packet. Data segments may be split between multiple packets with unique nonces for the purpose of improving protection by the encryption algorithm.

The encryption key may be received from a computer device 112, another computer, key manager, or other device that holds the encryption key to be used to encrypt the data segment. In one embodiment, encryption keys are transferred to the non-volatile memory controller 104 from one of a non-volatile memory device 102, computer device 112, computer, or other external agent which has the ability to execute industry standard methods to securely transfer and protect private and public keys.

In one embodiment, the encryption module 314 encrypts a first packet with a first encryption key received in conjunction with the packet and encrypts a second packet with a second encryption key received in conjunction with the second packet. In another embodiment, the encryption module 314 encrypts a first packet with a first encryption key received in conjunction with the packet and passes a second data packet on to the next stage without encryption. Beneficially, the encryption module 314 included in the write data pipeline 106 of the non-volatile memory device 102 allows data structure-by-data structure or segment-by-segment data encryption without a single file system or other external system to keep track of the different encryption keys used to store corresponding data structures or data segments. Each requesting device or related key manager independently manages encryption keys used to encrypt only the data structures or data segments sent by the requesting device.

In one embodiment, the encryption module 314 may encrypt the one or more packets using an encryption key unique to the non-volatile memory device 102. The encryption module 314 may perform this media encryption independently, or in addition to the encryption described above. Typically, the entire packet is encrypted, including the headers. In another embodiment, headers are not encrypted. The media encryption by the encryption module 314 provides a level of security for data stored in the non-volatile memory media 110. For example, where data is encrypted with media encryption unique to the specific non-volatile memory device 102, if the non-volatile memory media 110 is connected to a different non-volatile memory controller 104, non-volatile memory device 102, or computer device 112, the contents of the non-volatile memory media 110 typically could not be read without use of the same encryption key used during the write of the data to the non-volatile memory media 110 without significant effort.

In another embodiment, the write data pipeline 106 includes a compression module 312 that compresses the data for metadata segment prior to sending the data segment to the packetizer 302. The compression module 312 typically compresses a data or metadata segment using a compression routine known to those of skill in the art to reduce the storage size of the segment. For example, if a data segment includes a string of 512 zeros, the compression module 312 may replace the 512 zeros with code or token indicating the 512 zeros where the code is much more compact than the space taken by the 512 zeros.

In one embodiment, the compression module 312 compresses a first segment with a first compression routine and passes along a second segment without compression. In another embodiment, the compression module 312 compresses a first segment with a first compression routine and compresses the second segment with a second compression routine. Having this flexibility within the non-volatile memory device 102 is beneficial so that computer device 112 or other devices writing data to the non-volatile memory device 102 may each specify a compression routine or so that one can specify a compression routine while another specifies no compression. Selection of compression routines may also be selected according to default settings on a per data structure type or data structure class basis. For example, a first data structure of a specific data structure may be able to override default compression routine settings and a second data structure of the same data structure class and data structure type may use the default compression routine and a third data structure of the same data structure class and data structure type may use no compression.

In one embodiment, the write data pipeline 106 includes a garbage collector bypass 316 that receives data segments from the read data pipeline 108 as part of a data bypass in a garbage collection system. A garbage collection system typically marks packets that are no longer valid, typically because the packet is marked for deletion or has been modified and the modified data is stored in a different location. At some point, the garbage collection system determines that a particular storage division of storage may be recovered. A storage division for the garbage collection system is typically an erase block, such as a physical erase block or a logical erase block comprising a plurality of physical erase blocks. This determination may be due to a lack of available storage capacity, the percentage of data marked as invalid reaching a threshold, a consolidation of valid data, an error detection rate for that storage division of storage reaching a threshold, or improving performance based on data distribution, etc. Numerous factors may be considered by a garbage collection algorithm to determine when a storage division of storage is to be recovered.

Once a storage division of storage has been marked for recovery, valid packets in the storage division typically must be relocated. The garbage collector bypass 316 allows packets to be read into the read data pipeline 108 and then transferred directly to the write data pipeline 106 without being routed out of the non-volatile memory controller 104. In one embodiment, the garbage collector bypass 316 is part of an autonomous garbage collector system that operates within the non-volatile memory device 102. This allows the non-volatile memory device 102 to manage data so that data is systematically spread throughout the non-volatile memory media 110 to improve performance, data reliability and to avoid overuse and underuse of any one location or area of the non-volatile memory media 110 and to lengthen the useful life of the non-volatile memory media 110.

The garbage collector bypass 316 coordinates insertion of segments into the write data pipeline 106 with other segments being written by computer device 112 or other devices. In the depicted embodiment, the garbage collector bypass 316 is before the packetizer 302 in the write data pipeline 106 and after the depacketizer 324 in the read data pipeline 108, but may also be located elsewhere in the read and write data pipelines 106, 108. The garbage collector bypass 316 may be used during a flush of the write pipeline 108 to fill the remainder of the virtual page in order to improve the efficiency of storage within the non-volatile memory media 110 and thereby reduce the frequency of garbage collection.

In one embodiment, the write data pipeline 106 includes a write buffer 320 that buffers data for efficient write operations. Typically, the write buffer 320 includes enough capacity for packets to fill at least one virtual page in the non-volatile memory media 110. This allows a write operation to send an entire page of data to the non-volatile memory media 110 without interruption. By sizing the write buffer 320 of the write data pipeline 106 and buffers within the read data pipeline 108 to be the same capacity or larger than a storage write buffer within the non-volatile memory media 110, writing and reading data is more efficient since a single write command may be crafted to send a full virtual page of data to the non-volatile memory media 110 instead of multiple commands.

While the write buffer 320 is being filled, the non-volatile memory media 110 may be used for other read operations. This is advantageous because other non-volatile memory devices with a smaller write buffer or no write buffer may tie up the non-volatile memory when data is written to a storage write buffer and data flowing into the storage write buffer stalls. Read operations will be blocked until the entire storage write buffer is filled and programmed. Another approach for systems without a write buffer or a small write buffer is to flush the storage write buffer that is not full in order to enable reads. Again this is inefficient because multiple write/program cycles are required to fill a page.

For depicted embodiment with a write buffer 320 sized larger than a virtual page, a single write command, which includes numerous subcommands, can then be followed by a single program command to transfer the page of data from the storage write buffer in each non-volatile memory element 216, 218, 220 to the designated page within each non-volatile memory element 216, 218, 220. This technique has the benefits of eliminating partial page programming, which is known to reduce data reliability and durability and freeing up the destination bank for reads and other commands while the buffer fills.

In one embodiment, the write buffer 320 is a ping-pong buffer where one side of the buffer is filled and then designated for transfer at an appropriate time while the other side of the ping-pong buffer is being filled. In another embodiment, the write buffer 320 includes a first-in first-out ("FIFO") register with a capacity of more than a virtual page of data segments. One of skill in the art will recognize other write buffer 320 configurations that allow a virtual page of data to be stored prior to writing the data to the non-volatile memory media 110.

In another embodiment, the write buffer 320 is sized smaller than a virtual page so that less than a page of information could be written to a storage write buffer in the non-volatile memory media 110. In the embodiment, to prevent a stall in the write data pipeline 106 from holding up read operations, data is queued using the garbage collection system that needs to be moved from one location to another as part of the garbage collection process. In case of a data stall in the write data pipeline 106, the data can be fed through the garbage collector bypass 316 to the write buffer 320 and then on to the storage write buffer in the non-volatile memory media 110 to fill the pages of a virtual page prior to programming the data. In this way a data stall in the write data pipeline 106 would not stall reading from the non-volatile memory device 102.

In another embodiment, the write data pipeline 106 includes a write program module 310 with one or more user-definable functions within the write data pipeline 106. The write program module 310 allows a user to customize the write data pipeline 106. A user may customize the write data pipeline 106 based on a particular data requirement or application. Where the non-volatile memory controller 104 is an FPGA, the user may program the write data pipeline 106 with custom commands and functions relatively easily. A user may also use the write program module 310 to include custom functions with an ASIC, however, customizing an ASIC may be more difficult than with an FPGA. The write program module 310 may include buffers and bypass mechanisms to allow a first data segment to execute in the write program module 310 while a second data segment may continue through the write data pipeline 106. In another embodiment, the write program module 310 may include a processor core that can be programmed through software.

Note that the write program module 310 is shown between the input buffer 306 and the compression module 312, however, the write program module 310 could be anywhere in the write data pipeline 106 and may be distributed among the various stages 302-320. In addition, there may be multiple write program modules 310 distributed among the various states 302-320 that are programmed and operate independently. In addition, the order of the stages 302-320 may be altered. One of skill in the art will recognize workable alterations to the order of the stages 302-320 based on particular user requirements.

Read Data Pipeline

The read data pipeline 108 includes an ECC correction module 322 that determines if a data error exists in ECC blocks a requested packet received from the non-volatile memory media 110 by using ECC stored with each ECC block of the requested packet. The ECC correction module 322 then corrects any errors in the requested packet if any error exists and the errors are correctable using the ECC. For example, if the ECC can detect an error in six bits but can only correct three bit errors, the ECC correction module 322 corrects ECC blocks of the requested packet with up to three bits in error. The ECC correction module 322 corrects the bits in error by changing the bits in error to the correct one or zero state so that the requested data packet is identical to when it was written to the non-volatile memory media 110 and the ECC was generated for the packet.

If the ECC correction module 322 determines that the requested packets contains more bits in error than the ECC can correct, the ECC correction module 322 cannot correct the errors in the corrupted ECC blocks of the requested packet and sends an interrupt. In one embodiment, the ECC correction module 322 sends an interrupt with a message indicating that the requested packet is in error. The message may include information that the ECC correction module 322 cannot correct the errors or the inability of the ECC correction module 322 to correct the errors may be implied. In another embodiment, the ECC correction module 322 sends the corrupted ECC blocks of the requested packet with the interrupt and/or the message.

In one embodiment, a corrupted ECC block or portion of a corrupted ECC block of the requested packet that cannot be corrected by the ECC correction module 322 is read by the master controller 224, corrected, and returned to the ECC correction module 322 for further processing by the read data pipeline 108. In one embodiment, a corrupted ECC block or portion of a corrupted ECC block of the requested packet is sent to the device requesting the data. The requesting device, such as a computer device 112, may correct the ECC block or replace the data using another copy, such as a backup or mirror copy, and then may use the replacement data of the requested data packet or return it to the read data pipeline 108. The requesting device may use header information in the requested packet in error to identify data required to replace the corrupted requested packet or to replace the data structure to which the packet belongs. In another embodiment, the non-volatile memory controller 104 stores data using some type of RAID and is able to recover the corrupted data. In another embodiment, the ECC correction module 322 sends an interrupt and/or message and the receiving device fails the read operation associated with the requested data packet. One of skill in the art will recognize other options and actions to be taken as a result of the ECC correction module 322 determining that one or more ECC blocks of the requested packet are corrupted and that the ECC correction module 322 cannot correct the errors.

The read data pipeline 108 includes a depacketizer 324 that receives ECC blocks of the requested packet from the ECC correction module 322, directly or indirectly, and checks and removes one or more packet headers. The depacketizer 324 may validate the packet headers by checking packet identifiers, data length, data location, etc. within the headers. In one embodiment, the header includes a hash code that can be used to validate that the packet delivered to the read data pipeline 108 is the requested packet. The depacketizer 324 also removes the headers from the requested packet added by the packetizer 302. The depacketizer 324 may directed to not operate on certain packets but pass these forward without modification. An example might be a container label that is requested during the course of a rebuild process where the header information is required for index reconstruction. Further examples include the transfer of packets of various types destined for use within the non-volatile memory device 102. In another embodiment, the depacketizer 324 operation may be packet type dependent.

The read data pipeline 108 includes an alignment module 326 that receives data from the depacketizer 324 and removes unwanted data. In one embodiment, a read command sent to the non-volatile memory media 110 retrieves a packet of data. A device requesting the data may not require all data within the retrieved packet and the alignment module 326 removes the unwanted data. If all data within a retrieved page is requested data, the alignment module 326 does not remove any data.

The alignment module 326 re-formats the data as data segments of a data structure in a form compatible with a device requesting the data segment prior to forwarding the data segment to the next stage. Typically, as data is processed by the read data pipeline 108, the size of data segments or packets changes at various stages. The alignment module 326 uses received data to format the data into data segments suitable to be sent to the requesting device and joined to form a response. For example, data from a portion of a first data packet may be combined with data from a portion of a second data packet. If a data segment is larger than a data requested by the requesting device, the alignment module 326 may discard the unwanted data.

In one embodiment, the read data pipeline 108 includes a read synchronization buffer 328 that buffers one or more requested packets read from the non-volatile memory media 110 prior to processing by the read data pipeline 108. The read synchronization buffer 328 is at the boundary between the non-volatile memory clock domain and the local bus clock domain and provides buffering to account for the clock domain differences.

In another embodiment, the read data pipeline 108 includes an output buffer 330 that receives requested packets from the alignment module 326 and stores the packets prior to transmission to the requesting device. The output buffer 330 accounts for differences between when data segments are received from stages of the read data pipeline 108 and when the data segments are transmitted to other parts of the non-volatile memory controller 104 or to the requesting device. The output buffer 330 also allows the data bus 204 to receive data from the read data pipeline 108 at rates greater than can be sustained by the read data pipeline 108 in order to improve efficiency of operation of the data bus 204.

In one embodiment, the read data pipeline 108 includes a media decryption module 332 that receives one or more encrypted requested packets from the ECC correction module 322 and decrypts the one or more requested packets using the encryption key unique to the non-volatile memory device 102 prior to sending the one or more requested packets to the depacketizer 324. Typically the encryption key used to decrypt data by the media decryption module 332 is identical to the encryption key used by the media encryption module 318. In another embodiment, the non-volatile memory media 110 may have two or more partitions and the non-volatile memory controller 104 behaves as though it was two or more non-volatile memory controllers 104 each operating on a single partition within the non-volatile memory media 110. In this embodiment, a unique media encryption key may be used with each partition.

In another embodiment, the read data pipeline 108 includes a decryption module 334 that decrypts a data segment formatted by the depacketizer 324 prior to sending the data segment to the output buffer 330. The data segment may be decrypted using an encryption key received in conjunction with the read request that initiates retrieval of the requested packet received by the read synchronization buffer 328. The decryption module 334 may decrypt a first packet with an encryption key received in conjunction with the read request for the first packet and then may decrypt a second packet with a different encryption key or may pass the second packet on to the next stage of the read data pipeline 108 without decryption. When the packet was stored with a non-secret cryptographic nonce, the nonce is used in conjunction with an encryption key to decrypt the data packet. The encryption key may be received from a computer device 112, a client, key manager, or other device that manages the encryption key to be used by the non-volatile memory controller 104.

In another embodiment, the read data pipeline 108 includes a decompression module 336 that decompresses a data segment formatted by the depacketizer 324. In one embodiment, the decompression module 336 uses compression information stored in one or both of the packet header and the container label to select a complementary routine to that used to compress the data by the compression module 312. In another embodiment, the decompression routine used by the decompression module 336 is dictated by the device requesting the data segment being decompressed. In another embodiment, the decompression module 336 selects a decompression routine according to default settings on a per data structure type or data structure class basis. A first packet of a first object may be able to override a default decompression routine and a second packet of a second data structure of the same data structure class and data structure type may use the default decompression routine and a third packet of a third data structure of the same data structure class and data structure type may use no decompression.

In another embodiment, the read data pipeline 108 includes a read program module 338 that includes one or more user-definable functions within the read data pipeline 108. The read program module 338 has similar characteristics to the write program module 310 and allows a user to provide custom functions to the read data pipeline 108. The read program module 338 may be located as shown in FIG. 3, may be located in another position within the read data pipeline 108, or may include multiple parts in multiple locations within the read data pipeline 108. Additionally, there may be multiple read program modules 338 within multiple locations within the read data pipeline 108 that operate independently. One of skill in the art will recognize other forms of a read program module 338 within a read data pipeline 108. As with the write data pipeline 106, the stages of the read data pipeline 108 may be rearranged and one of skill in the art will recognize other orders of stages within the read data pipeline 108.

The non-volatile memory controller 104 includes control and status registers 340 and corresponding control queues 342. The control and status registers 340 and control queues 342 facilitate control and sequencing commands and sub-commands associated with data processed in the write and read data pipelines 106, 108. For example, a data segment in the packetizer 302 may have one or more corresponding control commands or instructions in a control queue 342 associated with the ECC generator 304. As the data segment is packetized, some of the instructions or commands may be executed within the packetizer 302. Other commands or instructions may be passed to the next control queue 342 through the control and status registers 340 as the newly formed data packet created from the data segment is passed to the next stage.

Commands or instructions may be simultaneously loaded into the control queues 342 for a packet being forwarded to the write data pipeline 106 with each pipeline stage pulling the appropriate command or instruction as the respective packet is executed by that stage. Similarly, commands or instructions may be simultaneously loaded into the control queues 342 for a packet being requested from the read data pipeline 108 with each pipeline stage pulling the appropriate command or instruction as the respective packet is executed by that stage. One of skill in the art will recognize other features and functions of control and status registers 340 and control queues 342.

The non-volatile memory controller 104 and or non-volatile memory device 102 may also include a bank interleave controller 344, a synchronization buffer 346, a storage bus controller 348, and a multiplexer ("MUX") 350.

Transferring Heat from Memory Components

Figure 4:
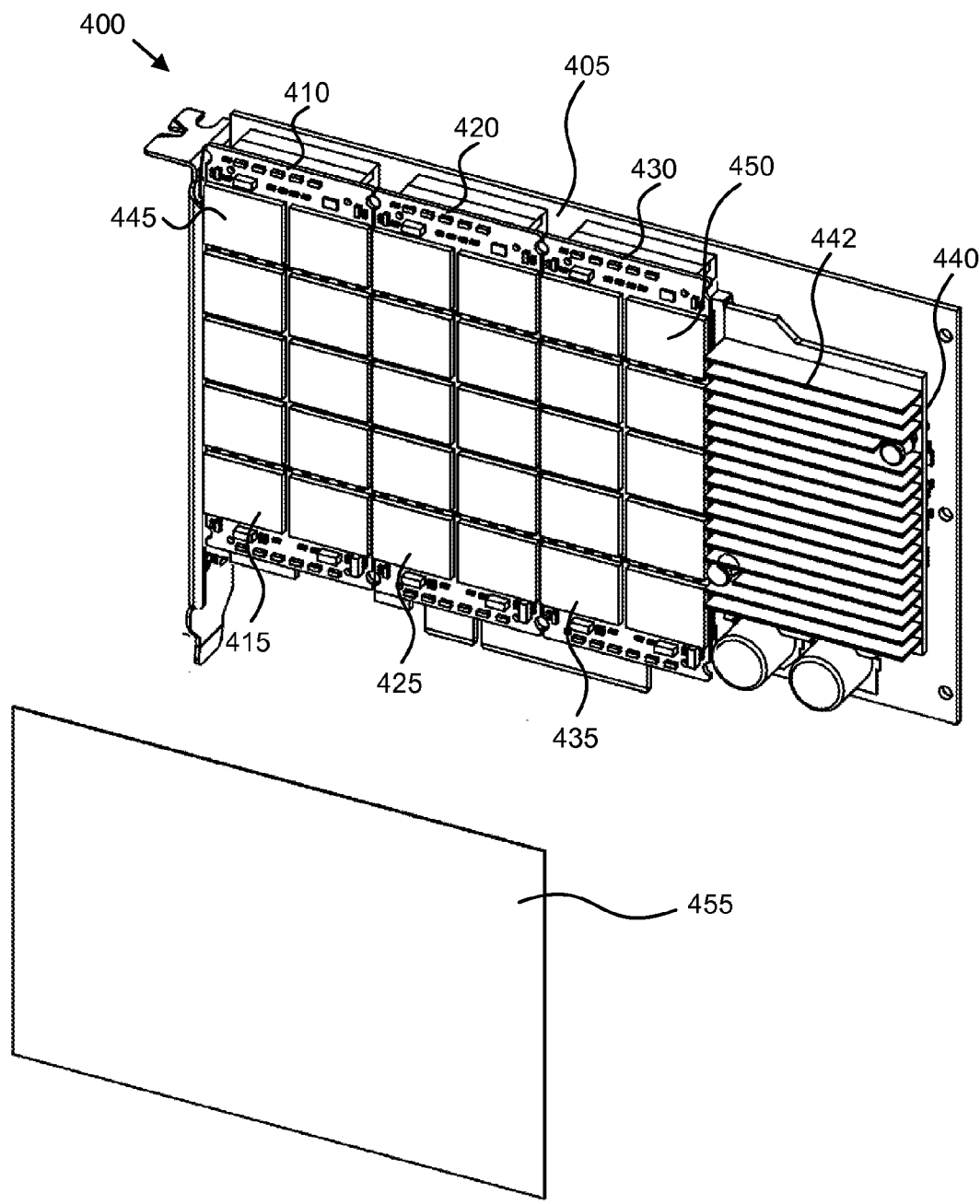
FIG. 4 is a perspective view illustrating one embodiment of a system to transfer heat from memory components.

FIG. 4 is a perspective view illustrating one embodiment of a system 400 to transfer heat from memory components, distribute heat between memory components, or the like. The system 400 includes a base substrate 405 with a plurality of secondary substrates 410, 420, 430, a plurality of non-volatile memory components 415, 425, 435 disposed on the plurality of secondary substrates 410, 420, 430, a hardware controller 440, and a heat spreading material 455. In one embodiment, the system 400 comprises one embodiment of the non-volatile memory device 102 as described above in relation to FIGS. 1-3.

The base substrate 405 provides mechanical support and electrical connections for the secondary substrates 410, 420, 430 and other components. For example, the base substrate 405 may include one or more electrical connectors to connect other components and/or other substrates, one or more embedded conductors to distribute electrical power and/or communications signals, one or more insulating layers, or the like. In one embodiment, the base substrate 405 may comprise a printed circuit board, a ceramic substrate, a film-type substrate, or the like. The secondary substrates 410, 420, 430 are disposed on, coupled to, and/or connected to the base substrate 405. In one embodiment, the secondary substrates 410, 420, 430 are connected to the base substrate 405 by way of electrical connectors disposed on the base substrate 405 and the secondary substrate. For example, the secondary substrates 410, 420, 430 may each include an edge connector along a side of the secondary substrate 410, 420, 430 which are configured for removable insertion into matching sockets on the base substrate 405, or the like. In one embodiment, the secondary substrates 410, 420, 430 may comprise printed circuit boards, ceramic substrates, film-type substrates, or the like. In one embodiment, one or more of the substrates 405, 410, 420, 430 may include a dielectric material or dielectric layers. Electrical connections, electrical conductors, electrically conductive layers or the like may be disposed on, in, and/or between the dielectric material or dielectric layers in one or more of the substrates 405, 410, 420, 430. In certain embodiments, thermal communication may also occur through one or more of the substrates 405, 410, 420, 430, in addition to the heat spreading material 455, although the substrates may not be as thermally conductive as the heat spreading material 455, described below. For example, electrical conductors of one or more of the substrates 405, 410, 420, 430 may conduct a certain amount of heat from the non-volatile memory components 415, 425, 435, but dielectric material of one or more of the substrates 405, 410, 420, 430 may have a low thermal conductivity and may thermally insulate the non-volatile memory components 415, 425, 435.

The secondary substrates 410, 420, 430 provide mechanical support and electrical connections for the non-volatile memory components 415, 425, 435 disposed on the secondary substrates 410, 420, 430. In the depicted embodiment, a first plurality of non-volatile memory components 415 is disposed on the first substrate 410, a second plurality of non-volatile memory components 425 is disposed on the second substrate 420, and a third plurality of non-volatile memory components 435 is disposed on the third substrate 430. In one embodiment, a particular non-volatile memory component 445 is connected, coupled, mounted, and/or attached to a particular secondary substrate 410 with solder between contacts on the non-volatile memory component 445 and pads on the secondary substrate 410, in a ball grid array or the like. In other embodiments, a particular non-volatile memory component 445 may be connected, coupled, mounted, and/or attached to a particular secondary substrate 410 with another type of electrical connection, such as with a land grid array socket, a pin grid array socket, an edge connector socket, or the like.

In one embodiment, the non-volatile memory components 415, 425, 435 comprise non-volatile memory elements 216, 218, 220 as described above in relation to FIG. 2. In one embodiment, each non-volatile memory component 415, 425, 435 includes multiple non-volatile memory elements 216, 218, 220. Each non-volatile memory component 415, 425, 435 may comprise one or more non-volatile memory medias 110 as described above in relation to FIG. 2. A non-volatile memory component 415, 425, 435 may be a chip, a die, a package, or other memory component. For example, each non-volatile memory component 415, 425, 435, in certain embodiments, may comprise a solid-state integrated circuit device with non-volatile memory media 110 as described above.

The hardware controller 440 is attached, coupled, and/or connected to the base substrate 405, a secondary substrate 410, 420, 430, or the like such that the hardware controller 440 is in electrical communication with one or more of the non-volatile memory components 415, 425, 435. For example, the hardware controller 440 may connect to the base substrate 405 by way of electrical connectors on the base substrate 405 and the hardware controller 440, such as a ball grid array, a land grid array socket, a pin grid array socket, an edge connector socket, or the like. In one embodiment, the hardware controller 440 is connected to the same substrate as the non-volatile memory components 415, 425, 435 or other components. In one embodiment, the hardware controller 440 is connected to a secondary substrate that is connected to the base substrate 405. In the depicted embodiment, the hardware controller 440 is disposed beneath a heat sink 442 to dissipate heat from the hardware controller 440. In one embodiment, heat dissipated from the heat sink 442 may spread to adjacent non-volatile memory components 435, raising the temperature of the adjacent non-volatile memory components 435.

The hardware controller 440 communicates with and manages the non-volatile memory components 415, 425, 435. In one embodiment, the hardware controller 440 includes the functionality of at least a portion of the non-volatile memory controller 104 described above in relation to FIGS. 1-3. In one embodiment, the hardware controller 440 is embodied as the non-volatile memory device controller 202 of FIG. 2. As described above with regard to the non-volatile memory controller 104 of FIG. 1, the hardware controller 440, in various embodiments, may comprise an FPGA, an ASIC, and/or one or more other integrated circuit logic devices. In one embodiment, the hardware controller 440 communicates with a host computer device 112 over one or more system buses, over a data network, or the like as described above. In certain embodiments, the hardware controller 440 coordinates and/or cooperates with driver software (e.g., installed on the host computer device 112) in accessing and managing the non-volatile memory components 415, 425, 435.

In one embodiment, the hardware controller 440 performs management functions on the non-volatile memory components 415, 425, 435. Management functions may include, but are not limited to, managing garbage collection to free erase blocks for reuse, performing wear leveling, setting read voltage thresholds, setting program voltage thresholds, and the like for the non-volatile memory components 415, 425, 435. The hardware controller 440 may perform management functions according to one or more management function parameters that specify when and/or how a management function is to be performed. Such management function parameters may include, but are not limited to read voltage threshold values, program voltage threshold values, garbage collection frequency, garbage collection criteria, and the like.

As described above, the garbage collection system may recover a storage division in response to a lack of available storage capacity, the percentage of data marked as invalid reaching a threshold, a consolidation of valid data, an error detection rate for that storage division satisfying a threshold, and the like. Garbage collection, in certain embodiments, provides wear leveling for the non-volatile memory components 415, 425, 435 and may ensure retention of valid data, increase a usable lifetime of the non-volatile memory components 415, 425, 435, or the like.

A read voltage threshold is a voltage level that separates discrete values stored in the storage cells of the non-volatile memory components 415, 425, 435. For SLC storage cells that store a single binary value, the read voltage threshold is the boundary between a binary one state and a binary zero state. For example, in one embodiment, a storage cell with a read voltage level above the read voltage threshold stores a binary one while a storage cell with a read voltage level below the read voltage threshold stores a binary zero. Other types of storage cells, such as MLC storage cells, may have multiple read voltage thresholds, to distinguish between more than two discrete states. For example, in one embodiment, MLC storage cells that store two bits may have three read voltage thresholds, separating binary values of 11, 01, 00, and 10. Three example read voltage thresholds may be X volts, Y volts, and Z volts. If the voltage read from a storage cell falls between Vmin and X volts, a binary 11 state is indicated. In certain embodiments, Vmin may be a negative voltage. If the voltage read from a storage cell falls between X volts and Y volts, a binary 01 state is indicated. If the voltage read from a storage cell falls between Y volts and Z volts, a binary 00 state is indicated. If the voltage read from a storage cell falls between Z volts and Vmax volts, a binary 10 state is indicated. In certain embodiments, the hardware controller 440 is configured to set or adjust read voltage thresholds for the non-volatile memory components 415, 425, 435 to reduce data errors in data read from the non-volatile memory components 415, 425, 435.

Certain management functions may be temperature dependent. Specifically, temperature of the non-volatile memory components 415, 425, 435 may alter stored read voltage levels of storage cells of the non-volatile memory components 415, 425, 435. As a result, if the read voltage level of a storage cell shifts past a read voltage threshold for the storage cell, a data error occurs, as the value of the data read from the storage cell is different from the value of the data written to the storage cell. Consequently, if a first non-volatile memory component 445 operates at a certain temperature and a second non-volatile memory component 450 operates at a different temperature and the hardware controller 440 uses a common read voltage threshold for both non-volatile memory components 445, 450, the values of data read from storage cells in the first non-volatile memory component 445 may be different than values of the same data read from storage cells in the second non-volatile memory component 450, due to the differing effects that the different temperatures have on the stored read voltage levels.

With regards to the garbage collection system, data stored on non-volatile memory components 435 operating under higher temperatures may have a shorter data retention time and/or a higher error rate in relation to non-volatile memory components 415, 425 operating under lower temperatures. As a result, data stored on higher temperature non-volatile memory components 435 may be in need of more frequent garbage collection. Furthermore, a logical storage division (e.g., a logical page, logical erase block) may include data stored on multiple non-volatile memory components 415, 425, 435. For example, a logical erase block may span multiple non-volatile memory components 415, 425, 435, including a portion of non-volatile memory media 110 from each of the multiple non-volatile memory components 415, 425, 435. In response to an increased error rate in certain non-volatile memory components 435 operating under higher temperatures, the hardware controller 440 may perform a garbage collection operation on an entire logical erase block more frequently than may be needed for data stored on non-volatile memory components 415, 425 of the same logical erase block, if the non-volatile memory components 415, 425 are operating under lower temperatures. Performing a garbage collection operation on a non-volatile memory component 415, 425, 435 more frequently than would otherwise be useful due to different operating temperatures, in certain embodiments, may cause the non-volatile memory components 415, 425, 435 to prematurely wear out, unnecessarily reducing a usable lifetime of the non-volatile memory components 415, 425, 435.

In one embodiment, the non-volatile memory components 415, 425, 435 are electrically coupled to one or more memory buses in parallel and the hardware controller 440 executes temperature dependent management functions in parallel on the non-volatile memory components 415, 425, 435. Memory buses may include storage I/O buses, address buses, control buses, data buses, and the like as described above with regard to the storage I/O buses 210 and the storage control buses 212 of FIGS. 2 and 3. Furthermore, the hardware controller 440, in one embodiment, applies common management function parameters to the plurality of non-volatile memory components 415, 425, 435. For example, the hardware controller 440 may set the same read voltage threshold for a first non-volatile memory component 445 that it sets for a second non-volatile memory component 450. In certain embodiments, one or more memory buses of the non-volatile memory components 415, 425, 435 may be hardwired in parallel, so that the non-volatile memory components 415, 425, 435 receive one or more commands from the hardware controller 440 in parallel and the hardware controller 440 may be prevented from sending a command to just a single non-volatile memory component 415, 425, 435 on the hardwired parallel memory buses without sending to the each of the parallel non-volatile memory components 415, 425, 435.

Temperature dependent management functions performed across multiple non-volatile memory components 415, 425, 435 may yield more consistent results if the temperatures of the non-volatile memory components 415, 425, 435 are also substantially consistent. Although non-volatile memory components 415, 425, 435 are not typically viewed as being heat-generating components in need of heat dissipation or heat distribution mechanisms, the non-volatile memory components 415, 425, 435 may, in certain embodiments, operate at varying temperatures. For example, the non-volatile memory components 435 located near other heat generating components, such as the hardware controller 440, may reach higher temperatures than those non-volatile memory components 415, 425 located farther away from the heat generating components. Similarly, a non-volatile memory component 415, 425, 435 located at the end of a row or column may operate at cooler temperature than a non-volatile memory component 415, 425, 435 in the middle of a row or column.

Therefore, to transfer heat from and/or distribute heat among the non-volatile memory components 415, 425, 435 and to increase uniformity of temperatures of the non-volatile memory components 415, 425, 435, the system 400 includes a heat spreading material 455 for placement in thermal communication with the non-volatile memory components 415, 425, 435.

Figure 5:
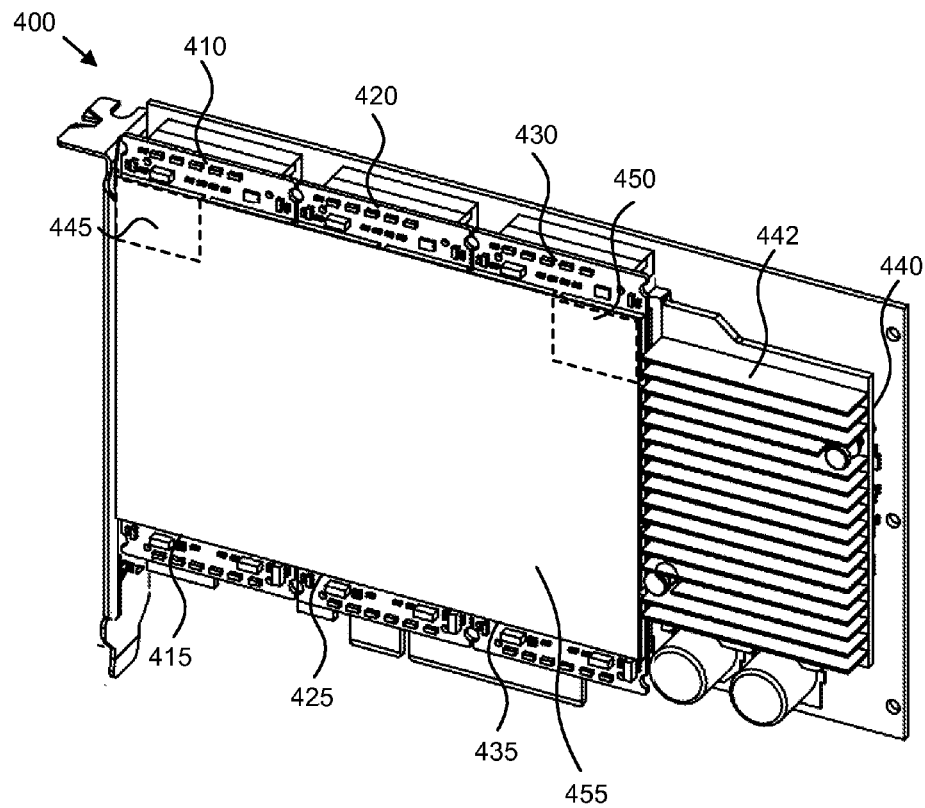
FIG. 5 is a perspective view illustrating the system of FIG. 4 with a heat spreading material in thermal communication with a plurality of memory components.

FIG. 5 depicts the heat spreading material 455 in thermal communication with the plurality of non-volatile memory components 415, 425, 435 of the system. Thermal communication, as used herein, means that heat from the non-volatile memory components 415, 425, 435 may be communicated and/or transferred, either directly or indirectly, to the heat spreading material 455. The heat spreading material 455 may be in thermal communication with the plurality of non-volatile memory components 415, 425, 435 by being directly adjacent to and in direct contact with the non-volatile memory components 415, 425, 435, by having a thermal paste and/or adhesive disposed between the non-volatile memory components 415, 425, 435 and the heat spreading material 455, by being integrated with the non-volatile memory components 415, 425, 435, or the like.

The heat spreading material 455 comprises a thermally conductive material capable of conducting, transferring, dissipating, communicating, distributing, and/or absorbing heat. In one embodiment, the heat spreading material 455 is configured to conduct, transfer, dissipate, communicate, distribute, and/or absorb heat from, among, or between the non-volatile memory components 415, 425, 435. In certain embodiments, the heat spreading material 455 may decrease a temperature difference between the non-volatile memory components 415, 425, 435. In one embodiment, as a particular non-volatile memory component 450 increases in temperature during operation, the heat spreading material 455 may transfer or distribute the heat from the non-volatile memory component 450 to a cooler non-volatile memory component 445, such that the temperature of the hotter non-volatile memory component 450 decreases and the temperature of the cooler non-volatile memory component 445 increases.

As a result, the hardware controller 440 may obtain more consistent results with temperature dependent management functions used on the non-volatile memory components 415, 425, 435. For example, the hardware controller 440 may use the same read voltage threshold for a first non-volatile memory component 445 and a second non-volatile memory component 450 even though the second non-volatile memory component 450 is located next to the hardware controller 440. The heat spreading material 455 may distribute and/or transfer heat from the second non-volatile memory component 450 among the other non-volatile memory components 415, 425, 435 to provide greater uniformity in operating temperatures. In the depicted embodiment, the heat spreading material 455 is a substantially planar, elongate sheet as described below.

Figure 6:
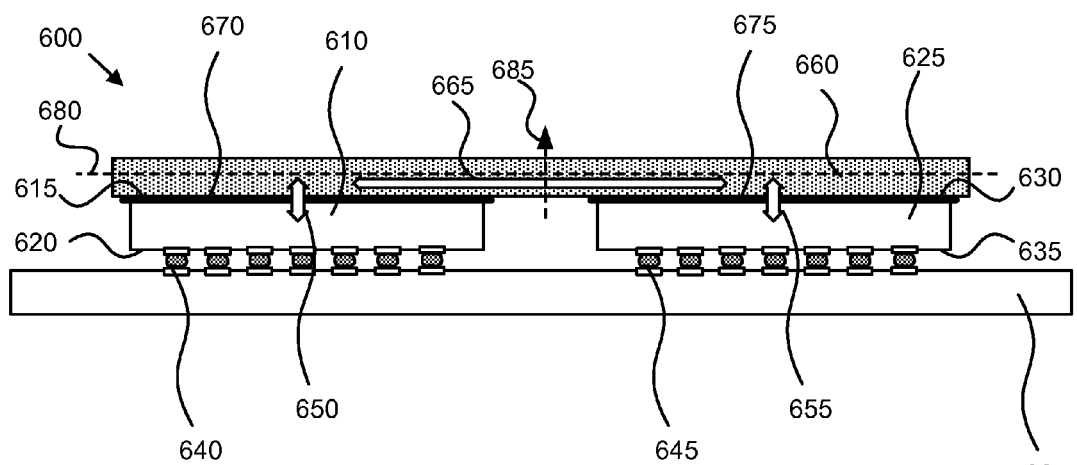
FIG. 6 is a side view illustrating one embodiment of an apparatus to transfer heat from memory components.

FIG. 6 depicts one embodiment of an apparatus 600 to transfer and/or distribute heat from memory components. The apparatus 600 includes a first non-volatile memory component 610 and second non-volatile memory component 625 disposed on a substrate 605. Furthermore, a heat spreading material 660 is in thermal communication with the first and second non-volatile memory components 610, 625. The first and second non-volatile memory components 610, 625 may comprise two of the plurality of non-volatile memory components 415, 425, 435 of FIGS. 4-5. Furthermore, although two non-volatile memory components 610, 625 are depicted, the apparatus 600 may include any suitable number of non-volatile memory components 610, 625 and the first and second non-volatile memory components 610, 625 may be representative of the plurality of non-volatile memory components 415, 425, 435 depicted in FIGS. 4-5, or the like. The substrate 605 may also comprise one of the substrates 410, 420, 430 from FIGS. 4-5 and provide mechanical support and electrical connections for the first and second non-volatile memory components 610, 625. Furthermore, although a single substrate 605 is depicted, the apparatus 600, in other embodiments, may include a plurality of substrates 605. In addition, the heat spreading material 660 comprises one embodiment of the heat spreading material 455 in FIGS. 4-5.

The heat spreading material 660, in the depicted embodiment, is disposed adjacent to a first side 615 of the first non-volatile memory component 650 and a first side 630 of the second non-volatile memory component 625. In the depicted embodiment, the first sides 615, 630 comprise the back sides of the first and second non-volatile memory components 610, 625, the sides 615 630 disposed opposite the electrical contacts of the first and second non-volatile memory components 610, 625. Electrical contacts of the first and second non-volatile memory components 610, 625, in the depicted embodiment, are soldered 640, 645 to contact pads disposed on the substrate 605 as described above, although any suitable electrical connection may be used. Solder 640, 645 electrically and mechanically connects a second side 620 of the first non-volatile memory component 610 and a second side 635 of the second non-volatile memory component 625 to the substrate 605. The second sides 620, 635 include a plurality of electrical contacts that are disposed in a pattern on the surface of the second sides 620, 630 corresponding with electrical contact pads disposed on the substrate 605, with solder connections 640, 645 between the electrical contacts of the first and second non-volatile memory components 610, 625 and the electrical contact pads of the substrate 605. The first sides 615, 630 of the first and second non-volatile memory components 610, 625 are opposite the second sides 620, 635 of the first and second non-volatile memory components 610, 625 respectively. In the depicted embodiment, the heat spreading material 660 spans the first and second non-volatile memory components 610, 625.

In one embodiment, the apparatus 600 includes one or more coupling mechanisms 670, 675 coupling the heat spreading material 660 to the first and second non-volatile memory components 610, 625. In one embodiment, the one or more coupling mechanisms 670, 675 may comprise one or more bolts, screws, levers, clamps, clips, or the like that couple or secure the heat spreading material 660 adjacent to the first and second non-volatile memory components 610, 625. In one embodiment, the one or more coupling mechanisms 670, 675 may comprise an adhesive, epoxy, paste, or the like disposed between the heat spreading material 660 and the first and second non-volatile memory components 610, 625 that couples or secures the heat spreading material 660 to the first and second non-volatile memory components 610, 625.

As depicted, the first and second non-volatile memory components 610, 625 communicate 650, 655 heat to/from the heat spreading material 660, which transfers 665 or distributes heat within a plane 680 of the heat spreading material 660. For example, if the first non-volatile memory component 610 has a higher temperature than the second non-volatile memory component 625, in one embodiment, the heat spreading material 660 absorbs heat from the first non-volatile memory component 610. The second non-volatile memory component 625 absorbs heat from the heat spreading material 660, thus reducing temperature differences between the first and second non-volatile memory components 610, 625. In certain embodiments, the heat spreading material 660 also dissipates heat, reducing the overall or average temperatures of the first and second non-volatile memory components 610, 625 in addition to spreading, distributing, and/or transferring heat between the first and second non-volatile memory components 610, 625.

As stated above, in one embodiment, the heat spreading material 660 comprises an elongate sheet. In one embodiment, the heat spreading material 660 comprises a thermally anisotropic material having a higher thermal conductivity within a plane 680 of the heat spreading material 660 than through 685 the plane 680. For example, the heat spreading material 660 may have a thermal conductivity along the plane 680 (e.g. the length and width of the heat spreading material 660) that is greater than through 685 the thickness of the heat spreading material 660. In certain embodiments, the thermal conductivity within a plane 680 of the heat spreading material 660 may be at least an order of magnitude greater than through 685 the plane 680, or the like. For example, the thermal conductivity within a plane 680 of the heat spreading material 660 along the length and the width may be between about 800 and 1200 $BTU \cdot in/ft^2 \cdot h \cdot F$ while the thermal conductivity through 685 the plane 680 of the heat spreading material 660 may be between about 30 and 90 $BTU \cdot in/ft^2 \cdot h \cdot F$, or the like. In certain embodiments, the thermally anisotropic material comprises a graphite based material, such as natural graphite, a graphite composite, pyrolytic graphite, graphite foil, or the like. In one embodiment, the heat spreading material 660 is a graphite sheet. The graphite sheet, in one embodiment, may have a thickness between about 0.01" to 0.06", or the like.

In one embodiment, the heat spreading material 660 comprises a thermally isotropic material having thermal conductivity that is substantially uniform in each direction. For example, in certain embodiments, the heat spreading material 660 may comprise a thermally isotropic metallic material, such as a copper material, an aluminum material, or other isotropic thermally conductive materials. In one embodiment, the heat spreading material 660 comprises a heat pipe formed of a metallic material such as copper, aluminum, or the like. A heat pipe, in certain embodiments, encases a liquid, such as water, ethanol, acetone, or the like, which transfers heat by vaporizing in areas of high heat and condensing back into liquid in cooler areas. A heat pipe may be tubular in shape, flat and planar in shape, or the like. A heat pipe, in certain embodiments, may be in thermal communication with a heat dissipating device as described below with regard to FIG. 8.

The apparatus 600 may include a single heat spreading material 660 (e.g., a single sheet) in thermal communication with a plurality of non-volatile memory components 415, 425, 435, as depicted in FIG. 5 in which a single sheet of heat spreading material 455 spans across the plurality of non-volatile memory components 415, 435, 435. In other embodiments, as depicted in FIG. 7, the apparatus includes a plurality of heat spreading materials 720, 735 in thermal communication with a plurality of non-volatile memory components 710, 715, 725, 730.

Figure 7:
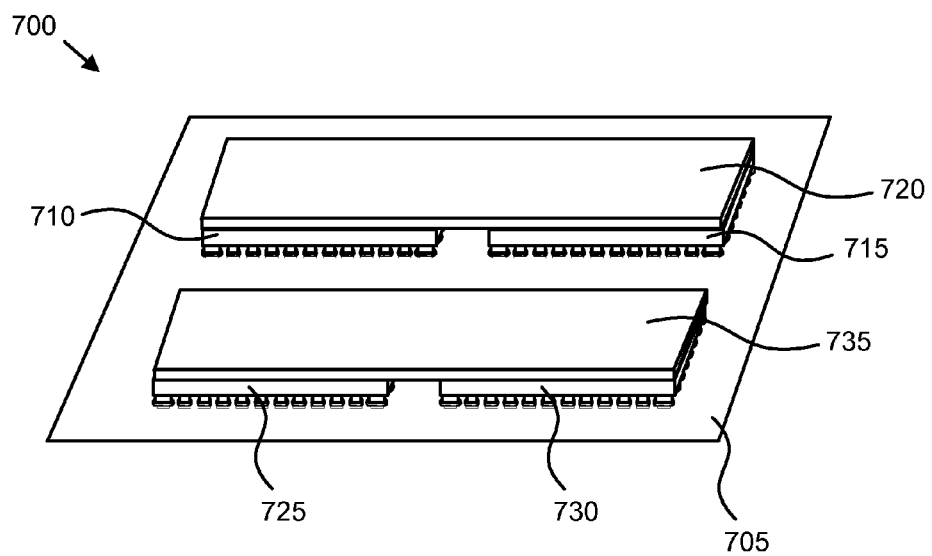
FIG. 7 is a perspective view illustrating one embodiment of an apparatus to transfer heat from memory components.

FIG. 7 depicts first and second non-volatile memory components 710, 715 in thermal communication with a first heat spreading material 720. FIG. 7 also depicts third and fourth non-volatile memory components 725, 730 in thermal communication with a second heat spreading material 735. In various embodiments, a single heat spreading material (e.g., a single sheet) spans each row of non-volatile memory components, each N number of rows of non-volatile memory components, each column of non-volatile memory components, each M number of columns of non-volatile memory components, or other suitable configurations.

Figure 8:
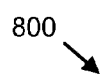
FIG. 8 is a perspective view illustrating another embodiment of an apparatus to transfer heat from memory components.

FIG. 8 depicts another embodiment of an apparatus 800 to transfer and/or distribute heat from or between memory components. FIG. 8 depicts first and second non-volatile memory components 810, 815 in thermal communication with a heat spreading material 820. In one embodiment, the heat spreading material 820 may comprise a heat pipe disposed adjacent to the first and second non-volatile memory components 810, 815, such as a flat planar heat pipe, a tubular heat pipe, or the like. The heat spreading material 820 is in thermal communication with (e.g., connected to, coupled with, or the like) a heat dissipating device 825 to dissipate heat from the heat spreading material 820. In the depicted embodiment, the heat dissipating device 825 comprises a heat sink with a plurality of fins configured to dissipate heat from the heat spreading material 820. As described above, in embodiments where the heat spreading material 820 comprises a heat pipe, a liquid inside the heat pipe 820 may vaporize in areas of the heat spreading material 820 adjacent to the non-volatile memory components 810, 815 and condense near the heat dissipating device 825, thus dissipating heat from the heat spreading material 820. In one embodiment, the heat dissipating device 825 is part of and/or integrated with the heat pipe 820. In other embodiments, the heat dissipating device 825 may comprise a chassis or housing of the computer device 112. In certain embodiments, other liquid or air cooling options may be used to dissipate heat from the non-volatile memory components 810, 815.

Figure 9A:
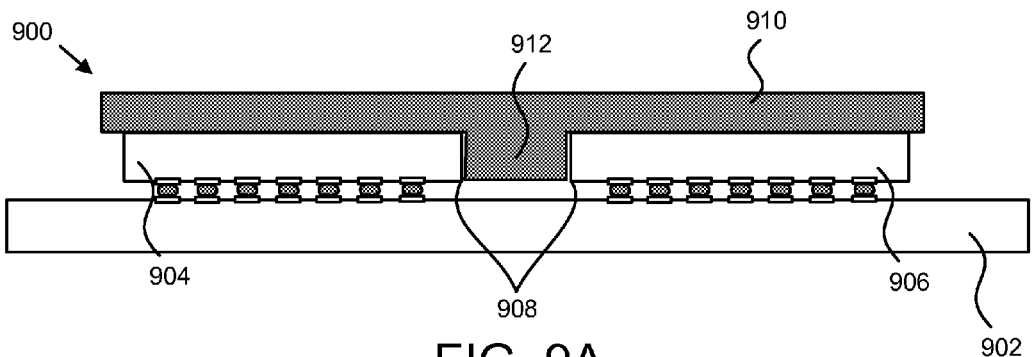
FIGS. 9A-9D are side views illustrating various embodiments of an apparatus to transfer heat from memory components.

FIG. 9A depicts one embodiment of an apparatus 900 to transfer and/or distribute heat from or between memory components. The apparatus 900 includes a substrate 902 and first and second non-volatile memory components 904, 906, which may be similar to the substrate 605 and the first and second non-volatile memory components 610, 625 in FIG. 6. The apparatus 900 includes a heat spreading material 910 at least partially disposed between the first non-volatile memory component 904 and the second non-volatile memory component 906. Specifically, in the depicted embodiment, the heat spreading material 910 includes an extension 912 that occupies at least a portion of a space 908 between the first non-volatile memory component 904 and the second non-volatile memory component 906. The heat spreading material 910, in the depicted embodiment, communicates heat from perimeter sides of the first and second non-volatile memory components 904, 906, as well as from upper surfaces/back sides of the first and second non-volatile memory components 904, 906.

Figure 9B:
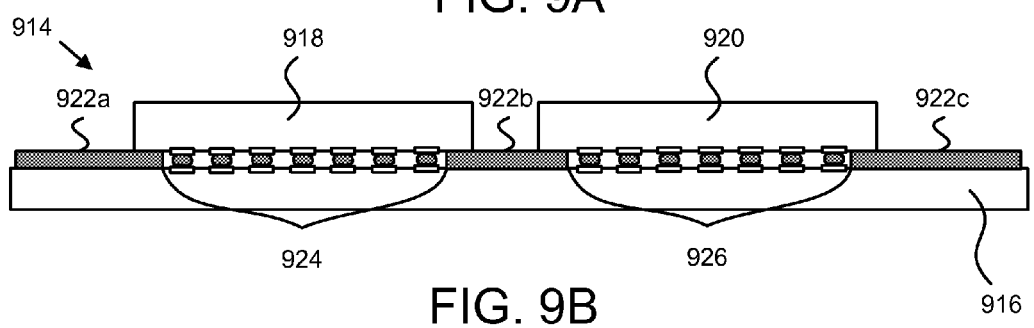

FIG. 9B depicts another embodiment of an apparatus 914 to transfer and/or distribute heat from or between memory components. The apparatus 914 includes first and second non-volatile memory components 918, 920, which may be similar to the first and second non-volatile memory components 610, 625 in FIG. 6. The apparatus 914 includes heat spreading material 922*a-c* disposed adjacent to the substrate 916. In the depicted embodiment, the heat spreading material 922*a-c* is disposed in an area at least partially between the first and second non-volatile memory components 918, 920 and the substrate 916. The heat spreading material 922*a-c*, in the depicted embodiment, includes gaps 924, 926 to accommodate electrical connections (e.g., ball grid array connections) between the first and second non-volatile memory components 918, 920 and the substrate 916. The heat spreading material 922*a-c* is configured to conduct heat from the sides of the first and second non-volatile memory components 918, 920 upon which electrical contacts are disposed (e.g., the front sides).

Figure 9C:
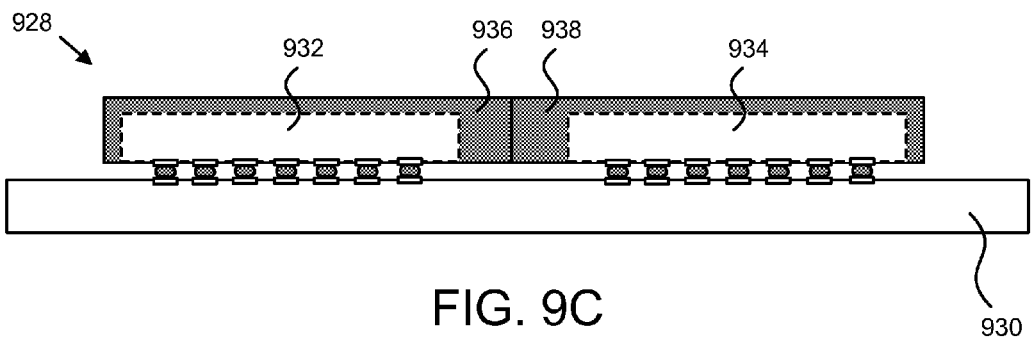

FIG. 9C depicts another embodiment of an apparatus 928 to transfer and/or distribute heat from or between memory components. The apparatus 928 includes a substrate 930, which may be similar to the substrate 605 in FIG. 6. The depicted embodiment includes first and second non-volatile memory components 932, 934 in which the heat spreading material is integrated with and/or an extension of a packaging 936, 938 of the first non-volatile memory component 932 and the second non-volatile memory component 934. In one embodiment, the packaging 936, 938 that includes the heat spreading material surrounds the integrated circuit of the chip or die comprising the first and second non-volatile memory components 932, 934. In the depicted embodiment, packaging 936 with heat spreading material of the first non-volatile memory component 932 is in thermal communication with and/or in contact with packaging 938 of heat spreading material of the second non-volatile memory component 934. The packaging 936, 938 of a non-volatile memory component 932, 934 may be encased in and/or have extensions of heat spreading material to bring the heat spreading material in thermal communication with packaging 936, 938 of other non-volatile memory components 932, 934.

Figure 9D:
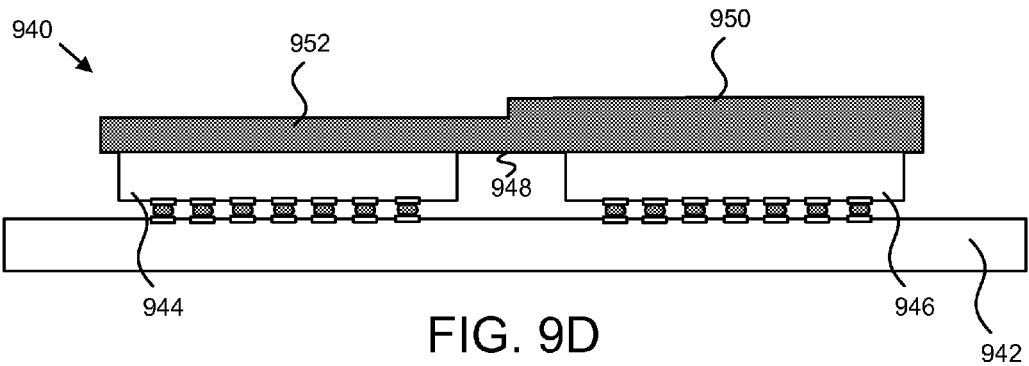

FIG. 9D depicts another embodiment of an apparatus 940 to transfer or distribute heat from or between memory components. The apparatus 940 includes a substrate 942 and first and second non-volatile memory components 944, 946, which may be similar to the substrate 605 and the first and second non-volatile memory components 610, 625 of FIG. 6. In the depicted embodiment, the heat spreading material 948 is shaped based on a thermal pattern characteristic of the first non-volatile memory component 944 and/or the second non-volatile memory component 946. A thermal pattern characteristic, as used herein, comprises a known, measured, and/or estimated distribution of operating temperatures for one or more non-volatile memory components. A thermal pattern characteristic, in various embodiments, may be based on a history of operating temperatures for one or more non-volatile memory components, a tendency or disposition of one or more non-volatile memory components to have an operating temperature or range of operating temperatures, an estimated operating temperature or range of operating temperatures for one or more non-volatile memory components, an average operating temperature or operating temperature differential for one or more non-volatile memory components, a proximity of one or more non-volatile memory components to a hardware controller, or the like.

In the depicted embodiment, based on a thermal pattern characteristic, a portion 950 of the heat spreading material 948 adjacent to the non-volatile memory component 946, that may operate under higher temperatures than the non-volatile memory component 944 of the like, is thicker than a portion 952 of the heat spreading material 948 adjacent to the non-volatile memory component 944, that may operate under lower temperatures. In other embodiments, the heat spreading material 948 may be shaped based on thermal pattern characteristics by covering less surface area of cooler non-volatile memory components 944 in comparison with hotter non-volatile memory components 946, or the like. As described above, a non-volatile memory component 946 disposed in closer proximity to a hardware controller 440 than another non-volatile memory component 944 may receive a transfer of heat from the hardware controller 440 and operate at a higher temperature than does the other non-volatile memory component 944 which is located further from the hardware controller 440.

Figure 10:
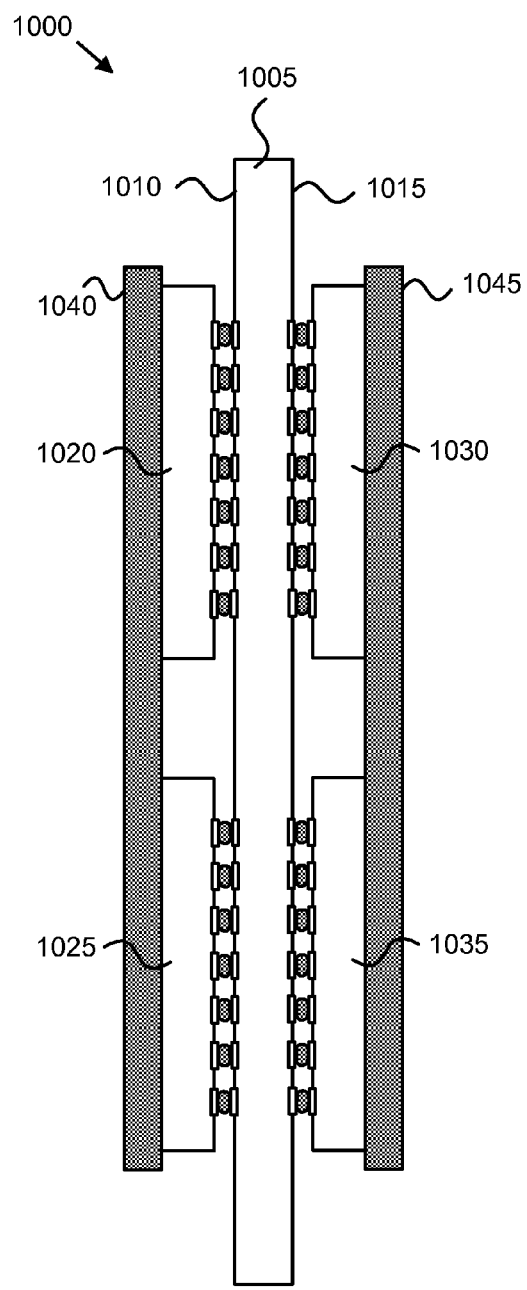
FIG. 10 is a side view illustrating another embodiment of an apparatus to transfer heat from memory components.

FIG. 10 depicts another embodiment of an apparatus 1000 to transfer and/or distribute heat from or between memory components. The apparatus 1000 includes a substrate 1005 with non-volatile memory components 1020, 1025, 1030, 1035 disposed on both sides 1010, 1015 of the substrate 1005. Specifically, the apparatus 1000 includes a first non-volatile memory component 1020 and a second non-volatile memory component 1025 disposed on a first side 1010 of the substrate 1005. The apparatus 1000 also includes a third non-volatile memory component 1030 and a fourth non-volatile memory component 1035 disposed on a second side 1015 of the substrate 1005 opposite the first side 1010 of the substrate 1005.

A first heat spreading material 1040 is in thermal communication with the first and second non-volatile memory components 1020, 1025 and a second heat spreading material 1045 is in thermal communication with the third and fourth non-volatile memory components 1030, 1035. Thus, temperature differences between non-volatile memory components 1020, 1025, 1030, 1035 on either side 1010, 1015 of the substrate 1005 may be reduced. Although the apparatus 1000 includes a single substrate 1005, other embodiments of the apparatus 1000 may include a plurality of substrates 1005 with any suitable number of non-volatile memory components 1020, 1025, 1030, 1035 on both sides of the substrates 1005. In certain embodiments, where the substrate 1005 comprises a secondary substrate 410, 420, 430 or the like, one side 1015 of the substrate 1005 may face a base substrate 405, with a heat spreading material 1045 disposed between the secondary substrate 410, 420, 430 and the base substrate 405.

Figure 11:
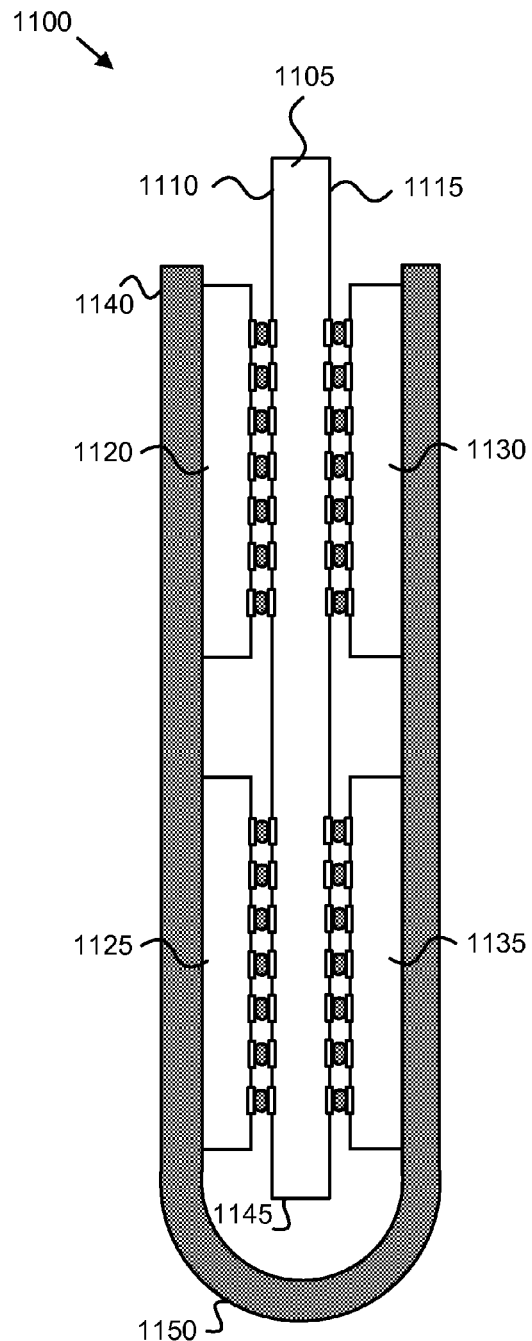
FIG. 11 is a side view illustrating yet another embodiment of an apparatus to transfer heat from memory components.

FIG. 11 depicts another embodiment of an apparatus 1100 to transfer and/or distribute heat from or between memory components. The apparatus 1100 is substantially similar to the apparatus 1000 of FIG. 10, and includes a first non-volatile memory component 1120 and a second non-volatile memory component 1125 disposed on a first side 1110 of the substrate 1105 and a third non-volatile memory component 1130 and a fourth non-volatile memory component 1135 disposed on a second side 1115 of the substrate 1105.

The apparatus 1100 differs from the apparatus 1000 of FIG. 10 in that a single heat spreading material 1140 is in thermal communication with the plurality of non-volatile memory components 1120, 1125, 1130, 1135. In the depicted embodiment, the heat spreading material 1140 wraps around an end 1145 of the substrate 1105 to transfer heat from and/or distribute heat between the non-volatile memory components 1120, 1125, on the first side 1110 of the substrate 1105 and the non-volatile memory components 1130, 1135 on the second side 1115 of the substrate 1105. In other embodiments, the heat spreading material 1140 wraps around two or more ends, sides, and/or edges of the substrate 1105. In one embodiment, the heat spreading material 1140 comprises a substantially continuous material bent, wrapped, or otherwise formed around the ends, sides, and/or edges 1145 of the substrate 1105. In other embodiments, the heat spreading material 1140 may comprise a plurality of individual components of heat spreading material 1140 in thermal communication with each other to transfer and/or distribute heat to multiple sides 1110, 1115 of the substrate 1105.

Figure 12:
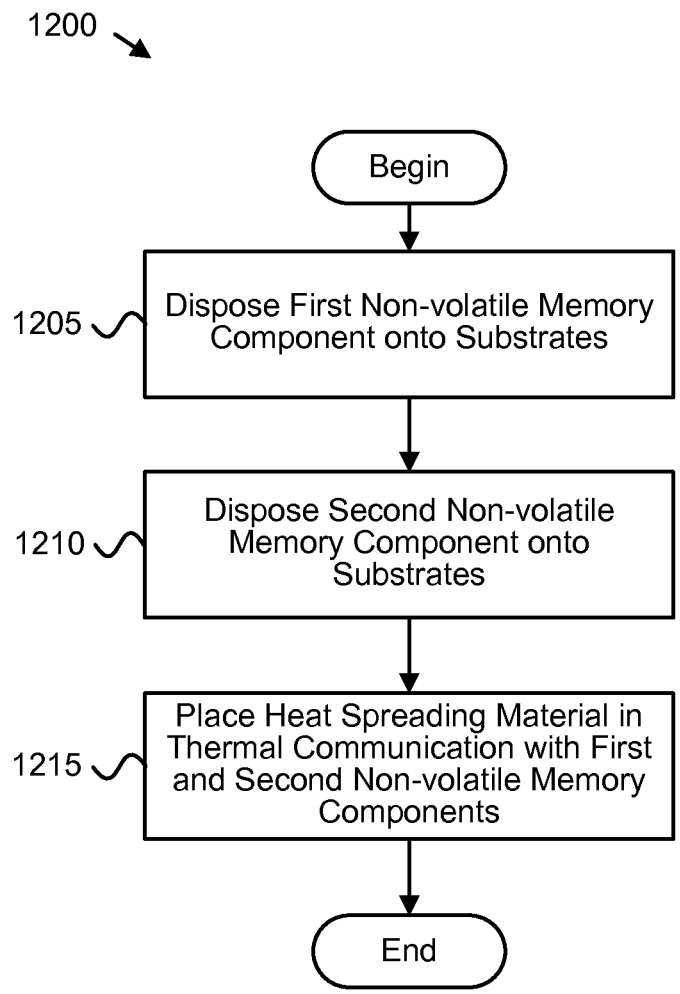
FIG. 12 is a schematic flow chart diagram illustrating one embodiment of a method to transfer heat from memory components.

FIG. 12 is a schematic flow chart diagram illustrating one embodiment of a method 1200 to transfer heat from and/or distribute heat between memory components. The description of the method 1200 refers to elements of FIG. 6, like numbers referring to like elements. The method 1200, in one embodiment, is performed by an assembler. The assembler may include an assembly worker, an automated mechanical and/or electrical process, a combination of an assembly worker and an automated process, or the like. The method 1200 begins and the assembler disposes 1205 a first non-volatile memory component 610 on one or more substrates 605. The assembler disposes 1210 the second non-volatile memory component 625 on the one or more substrates 605. The assembler may dispose 1205, 1210 the first and/or second non-volatile memory components 610, 625 on the one or more substrates 605 by electrically coupling the first and second non-volatile memory components 610, 625 to the one or more substrates 605. For example, the assembler may solder the first and second non-volatile memory components 610, 625 to the one or more substrates 605, insert first and second non-volatile memory components 610, 625 into electrical connectors disposed on the one or more substrates 605, or the like. The one or more substrates 605 may be configured to provide mechanical support and electrical connections for the first and second non-volatile memory components 610, 625.

The assembler places 1215 a heat spreading material 660 in thermal communication with the first non-volatile memory component 610 and the second non-volatile memory component 625. The heat spreading material 660 is configured to transfer heat from and/or to distribute heat between the first non-volatile memory component 610 and the second non-volatile memory component 625. The heat spreading material 660 may be a graphite based material, a copper material, an aluminum material, or the like. In one embodiment, the assembler couples the heat spreading material 660 to the first and second non-volatile memory components 610, 625 using a coupling mechanism 670, 675 such as one or more clamps, clips, adhesives, epoxies, pastes, or the like and the method 1200 ends. In other embodiments, the method 1200 may include a hardware controller 440 executing one or more temperature dependent management functions in parallel on the first and second non-volatile memory components 610, 625.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
   one or more substrates configured to provide mechanical support and electrical connections for a plurality of non-volatile memory components;
   a thermally conductive material configured to transfer heat from the plurality of non-volatile memory components; and
   a controller configured to execute one or more temperature dependent management functions on two or more of the plurality of non-volatile memory components in parallel.

2. The apparatus of claim 1, wherein the thermally conductive material is configured to cover a top surface of each of the plurality of non-volatile memory components, and to cover at least a portion of one or more side surfaces of each of the plurality of non-volatile memory components.

3. The apparatus of claim 2, wherein the thermally conductive material comprises:
   an elongate sheet configured to cover the top surfaces of each of the plurality of non-volatile memory components; and
   one or more extensions configured to cover at least a portion of the one or more side surfaces of the plurality of non-volatile memory components.

4. The apparatus of claim 3, wherein an extension of the thermally conductive material is configured to cover side surfaces of two or more of the plurality of non-volatile memory components.

5. The apparatus of claim 1, wherein a first memory component of the plurality of non-volatile memory components is disposed on a first side of a substrate of the one or more substrates, and a second memory component of the plurality of non-volatile memory components is disposed on a second side of the substrate, opposite the first side, and wherein the thermally conductive material is thermally coupled to a top surface of both the first memory component and the second memory component.

6. The apparatus of claim 1, wherein the one or more temperature dependent management functions comprise one or more of garbage collection operations on the non-volatile memory components, determining a data retention time for data stored on the non-volatile memory components, determining an expected error rate for data stored on respective non-volatile memory components, and determining read voltage levels for the non-volatile memory components.

7. An apparatus comprising:
   a heat spreading material in thermal communication with a first non-volatile memory component and a second non-volatile memory component, the heat spreading material configured to transfer heat from the first non-volatile memory component and the second non-volatile memory component; and
   a controller configured to execute one or more temperature dependent management functions in parallel on the first non-volatile memory component and the second non-volatile memory component.

8. The apparatus of claim 7, wherein the heat spreading material comprises a thermally anisotropic material having higher thermal conductivity within a plane of the heat spreading material than through the plane.

9. The apparatus of claim 8, wherein the thermally anisotropic material comprises a graphite based material.

10. The apparatus of claim 7, wherein the heat spreading material comprises a thermally isotropic material.

11. The apparatus of claim 10, wherein the thermally isotropic material comprises one of a copper material and an aluminum material.

12. The apparatus of claim 7, wherein the heat spreading material comprises an elongate sheet disposed adjacent to the first and second non-volatile memory components.

13. The apparatus of claim 7, wherein the heat spreading material comprises a heat pipe disposed adjacent to the first and second non-volatile memory components.

14. The apparatus of claim 7, further comprising one or more substrates for the first non-volatile memory component and the second non-volatile memory component, the one or more substrates providing mechanical support and electrical connections for the first and second non-volatile memory components.

15. The apparatus of claim 7, wherein the controller is disposed adjacent to one of the first non-volatile memory component and the second non-volatile memory component such that the controller increases heat in the one of the first non-volatile memory component and the second non-volatile memory component.

16. The apparatus of claim 7, wherein the first and second non-volatile memory components are electrically coupled to one or more memory buses in parallel.

17. The apparatus of claim 7, wherein the one or more temperature dependent management functions comprise managing a frequency of garbage collection operations on the first non-volatile memory component and the second non-volatile memory component.

18. The apparatus of claim 7, wherein the one or more temperature dependent management functions comprise determining read voltage levels for the first non-volatile memory component and the second non-volatile memory component.

19. A system comprising:
   one or more substrates;
   a first non-volatile memory component disposed on the one or more substrates;
   a second non-volatile memory component disposed on the one or more substrates;
   a thermally conductive material in thermal communication with the first non-volatile memory component and the second non-volatile memory component, the thermally conductive material configured to decrease heat in one of the first non-volatile memory component and the second non-volatile memory component; and
   a hardware controller for the first non-volatile memory component and the second non-volatile memory component, wherein the hardware controller is configured to execute one or more temperature dependent management functions in parallel on the first non-volatile memory component and the second non-volatile memory component.

20. The system of claim 19, further comprising a host device in communication with the hardware controller over one or more system buses.

21. The system of claim 19, wherein the hardware controller is disposed adjacent to one of the first non-volatile memory component and the second non-volatile memory component such that the hardware controller increases heat in the one of the first non-volatile memory component and the second non-volatile memory component.

22. The system of claim 19, wherein the first non-volatile memory component and the second non-volatile memory component are disposed on a first side of the one or more substrates, the system further comprising a third non-volatile memory component disposed on a second side of the one or more substrates and a fourth non-volatile memory component disposed on the second side of the one or more substrates.

23. The system of claim 22, wherein the thermally conductive material is in thermal communication with the third non-volatile memory component and the fourth non-volatile memory component.

24. The system of claim 22, further comprising a second thermally conductive material in thermal communication with the third non-volatile memory component and the fourth non-volatile memory component.

25. The system of claim 19, wherein the one or more temperature dependent management functions include determining a frequency for garbage collection operations on each of the first non-volatile memory component and the second non-volatile memory component.

26. The system of claim 19, wherein the one or more temperature dependent management functions include determining respective read voltage levels for the first non-volatile memory component and the second non-volatile memory component.

* * * * *